(12) United States Patent
Pang et al.

(10) Patent No.: US 9,830,963 B1
(45) Date of Patent: Nov. 28, 2017

(54) WORD LINE-DEPENDENT AND TEMPERATURE-DEPENDENT ERASE DEPTH

(71) Applicant: SanDisk Technologies LLC, Plano, TX (US)

(72) Inventors: Liang Pang, Fremont, CA (US); Vinh Diep, San Jose, CA (US); Ching-Huang Lu, Fremont, CA (US); Yingda Dong, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/163,171

(22) Filed: May 24, 2016

(51) Int. Cl.
*G11C 7/14* (2006.01)
*G11C 7/04* (2006.01)
*G11C 7/06* (2006.01)
*G11C 7/22* (2006.01)

(52) U.S. Cl.
CPC .......... *G11C 7/14* (2013.01); *G11C 7/04* (2013.01); *G11C 7/062* (2013.01); *G11C 7/22* (2013.01)

(58) Field of Classification Search
CPC ....... G11C 16/08; G11C 16/24; G11C 16/107; G11C 16/16
USPC ..... 365/185.23, 185.25, 185.11, 208, 185.17
See application file for complete search history.

(56) References Cited

U.S. PATENT DOCUMENTS

| | | | |
|---|---|---|---|
| 7,583,539 B2 | 9/2009 | Sekar et al. | |
| 8,804,425 B2 | 8/2014 | Chen et al. | |
| 8,879,330 B1 | 11/2014 | Mu et al. | |
| 9,312,010 B1 | 4/2016 | Yuan et al. | |
| 9,343,171 B1 | 5/2016 | Sun et al. | |
| 2006/0285408 A1* | 12/2006 | Betser | G11C 16/3404 365/212 |
| 2007/0047327 A1* | 3/2007 | Goda | G11C 8/08 365/185.29 |
| 2007/0291566 A1 | 12/2007 | Mokhlesi et al. | |
| 2011/0128791 A1 | 6/2011 | Chang et al. | |
| 2012/0033503 A1* | 2/2012 | Kim | G11C 16/16 365/185.33 |

(Continued)

OTHER PUBLICATIONS

U.S. Appl. No. 14/617,182, filed Feb. 9, 2015 by Y. Sun et al., Reduced Erase-Verify Voltage for First-Programmed Word Line in a Memory Device.

(Continued)

*Primary Examiner* — Alexander Sofocleous
*Assistant Examiner* — Alfredo Bermudez Lozada
(74) *Attorney, Agent, or Firm* — Vierra Magen Marcus LLP

(57) ABSTRACT

Techniques are provided for reducing program disturb and short term data retention loss. Program disturb becomes worse for the drain-side memory cells at higher temperatures, while data retention generally does not become worse at higher temperatures. In one aspect, a deeper erase is provided for drain-side memory cells when the temperature is relatively high, to reduce program disturb. In another aspect, the verify levels of the programmed data states are lowered to reduce data retention loss when the temperature is relatively high. In another aspect, the number of read errors is used to adjust the depth of the depth of the erase operation. In another aspect, a pass voltage of a drain-side cell is lowered during a verify test for another cell to account for the deep erase of the drain-side cell.

19 Claims, 29 Drawing Sheets

(56) References Cited

U.S. PATENT DOCUMENTS

| | | |
|---|---|---|
| 2014/0119121 A1 | 5/2014 | Aritome |
| 2014/0204694 A1 | 7/2014 | Choy |
| 2014/0247668 A1* | 9/2014 | Costa ................ G11C 16/3445 365/185.22 |
| 2016/0093387 A1 | 3/2016 | Oh et al. |
| 2016/0118131 A1 | 4/2016 | Dong et al. |

OTHER PUBLICATIONS

International Search Report & The Written Opinion of the International Searching Authority dated Jul. 13, 2017, International Application No. PCT/US2017/018551.

* cited by examiner

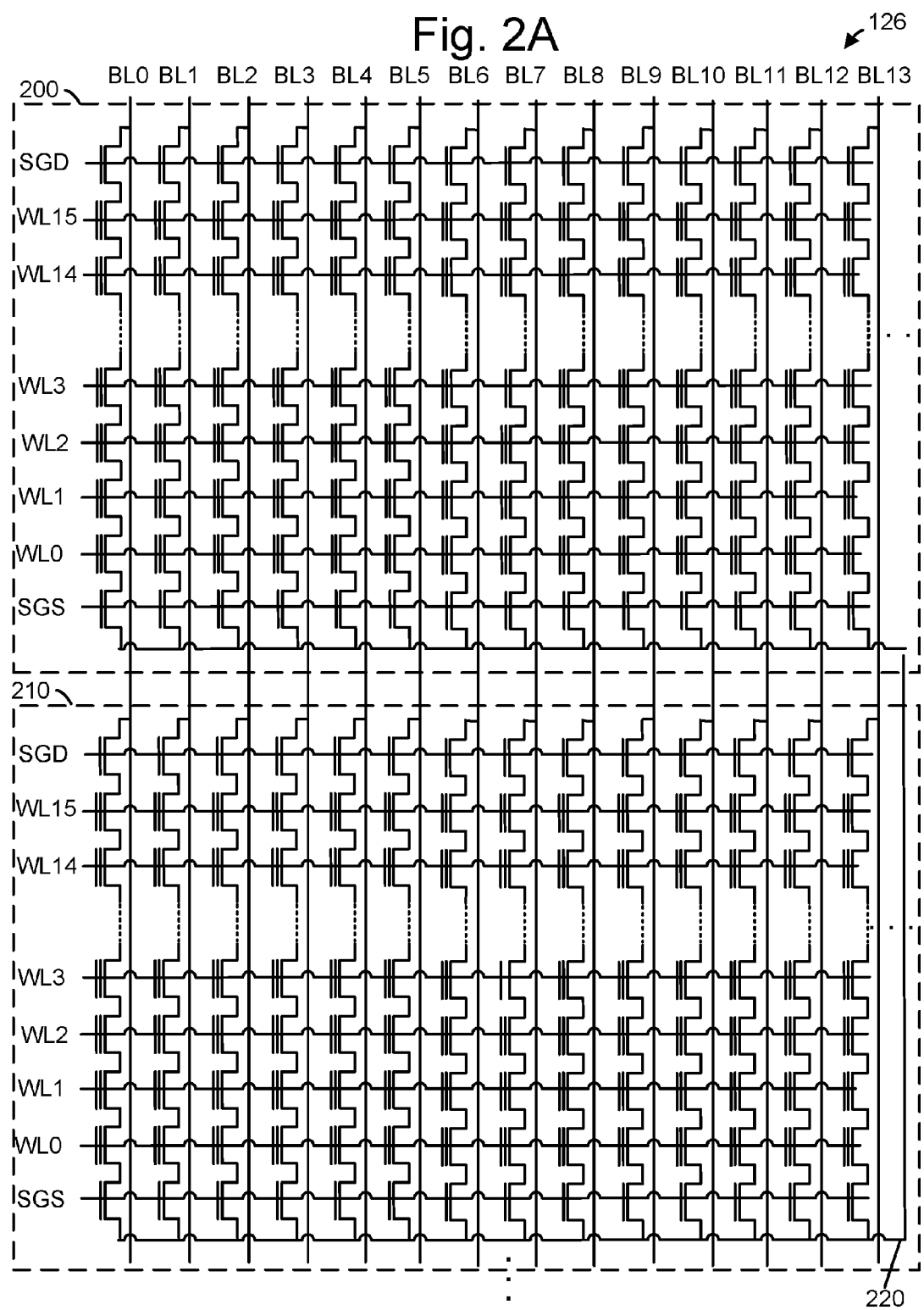

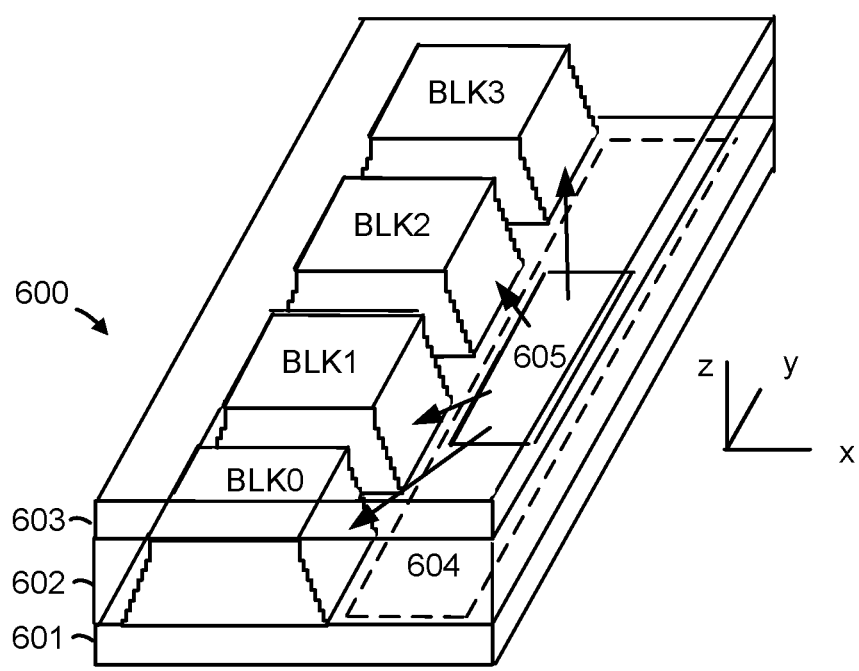

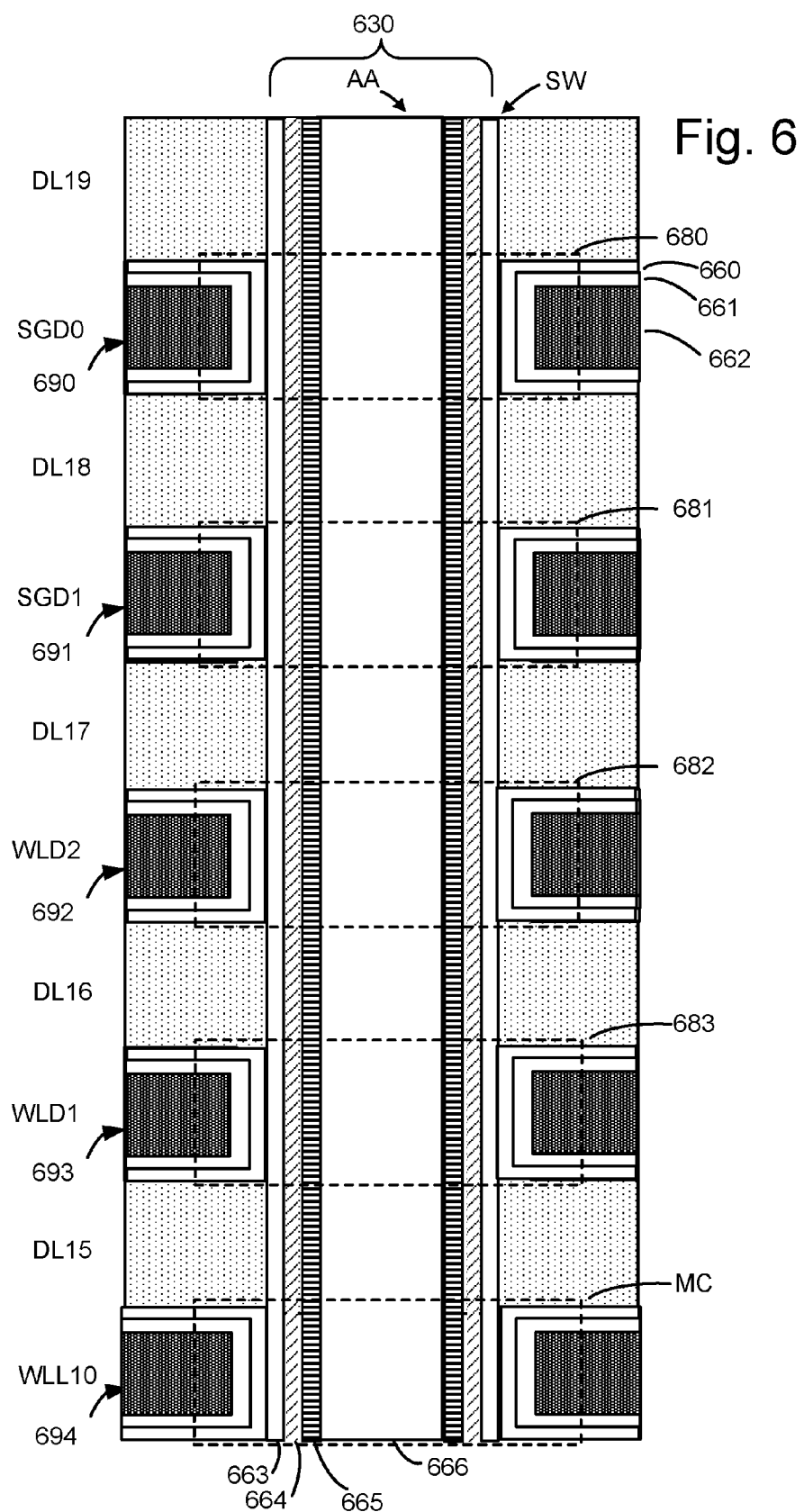

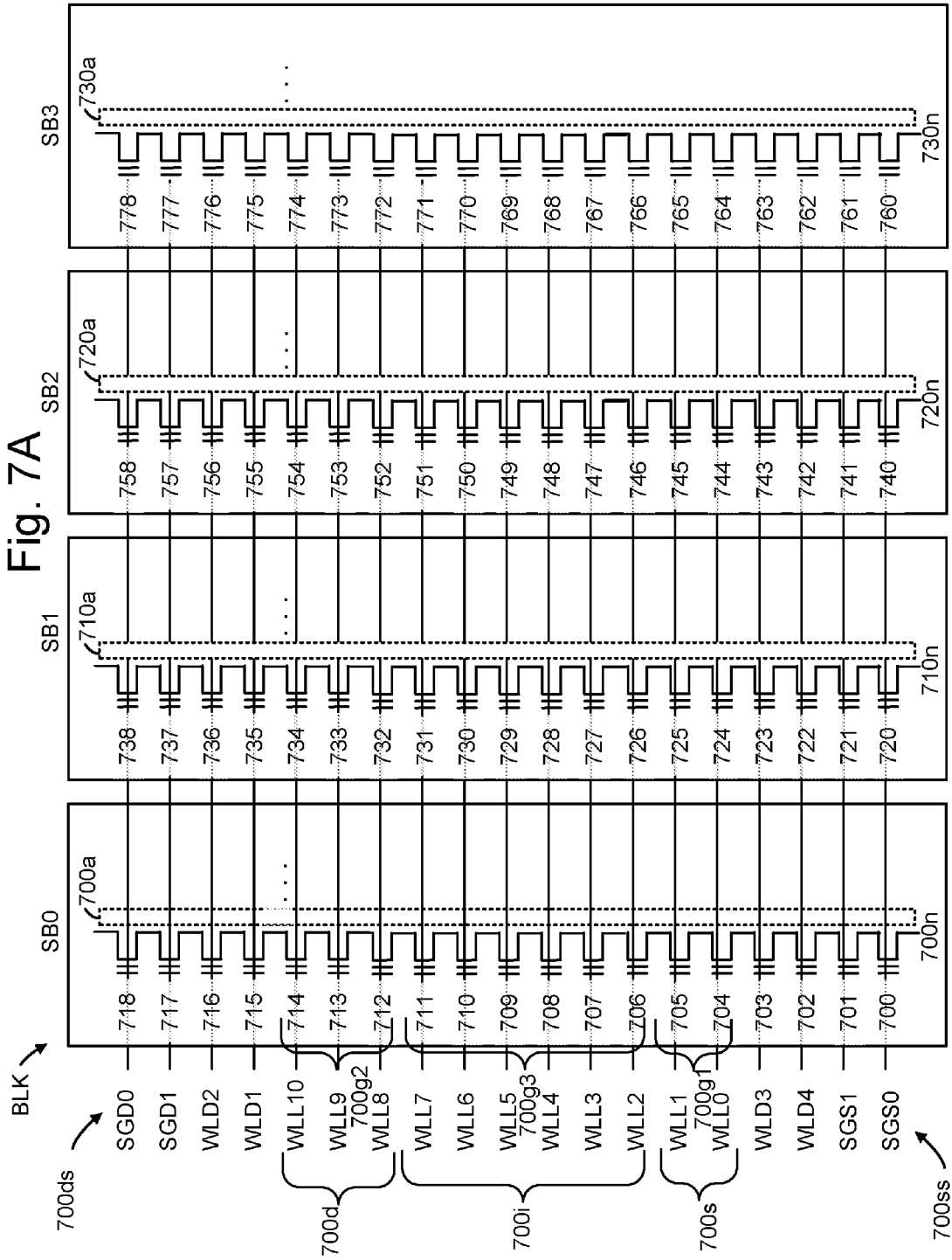

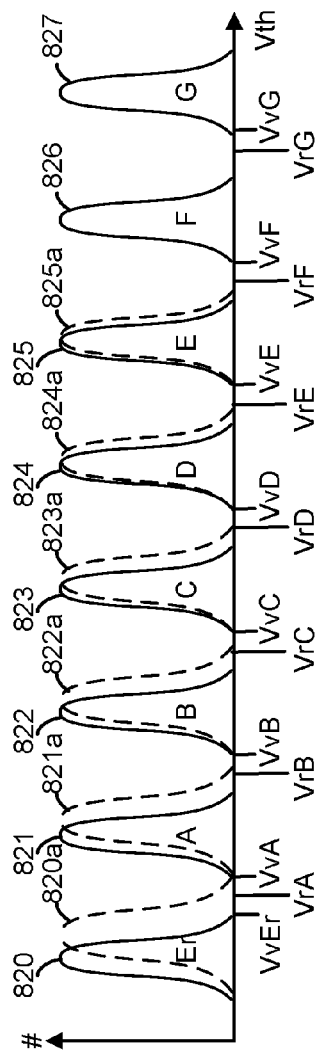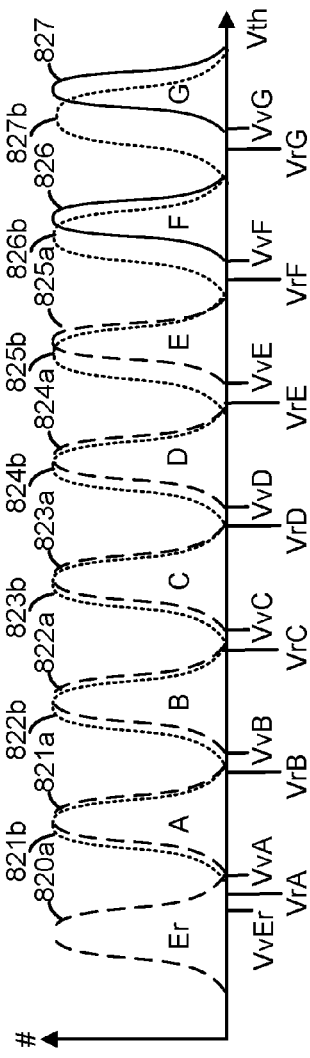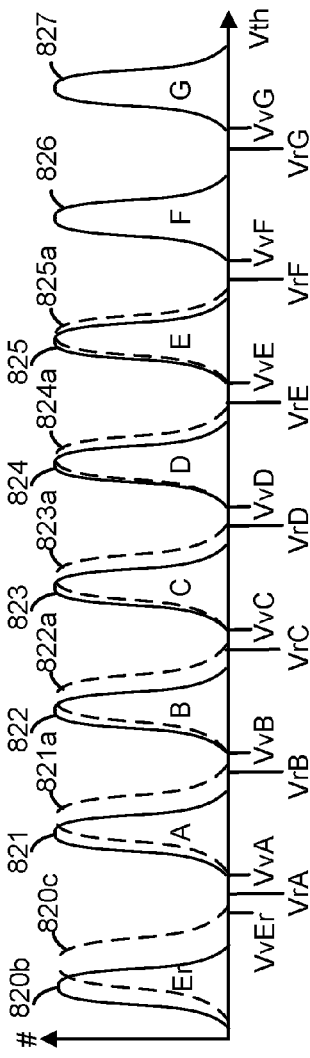

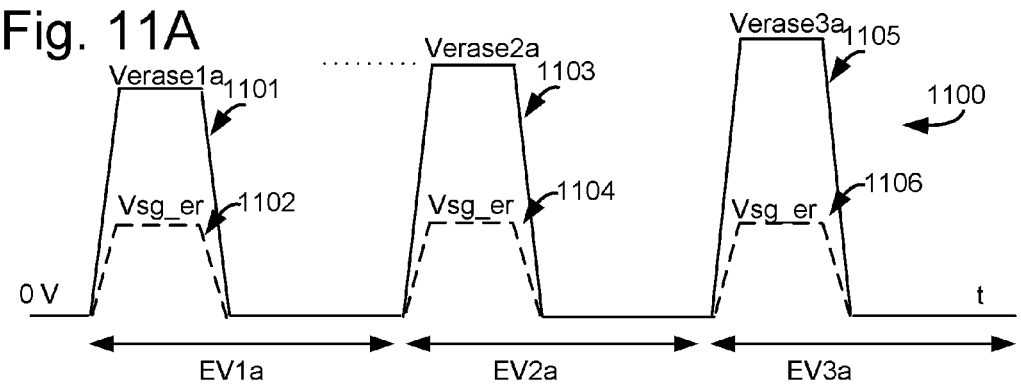
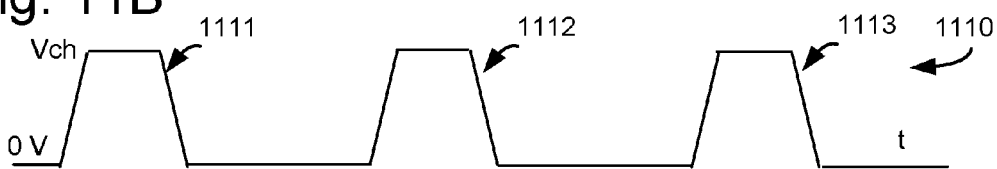
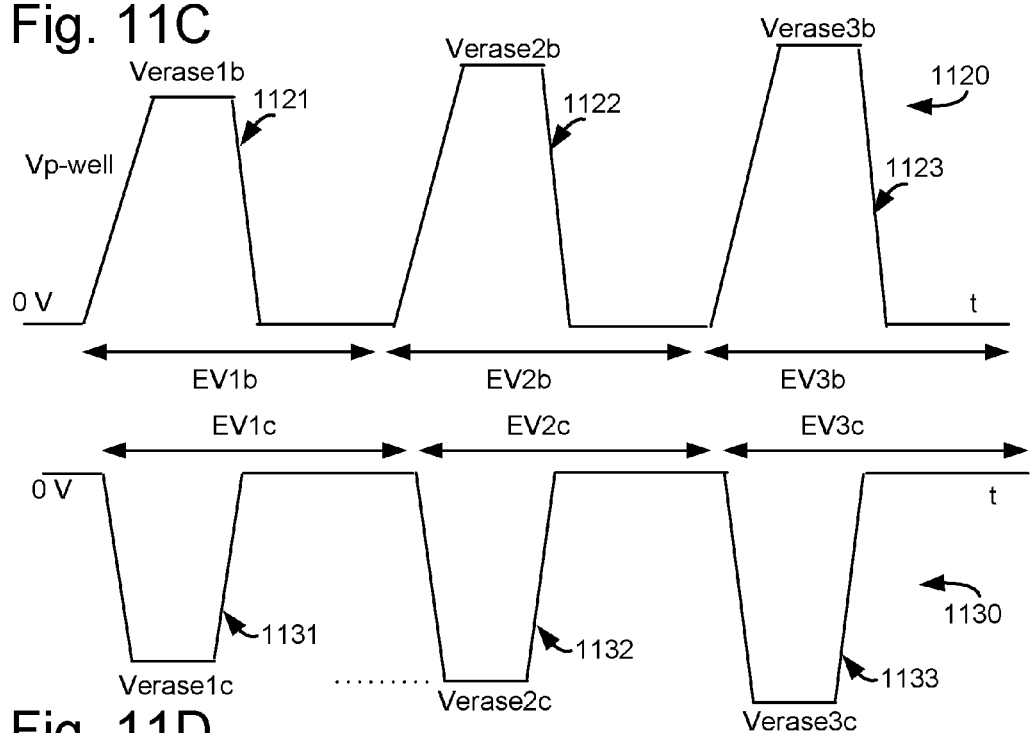
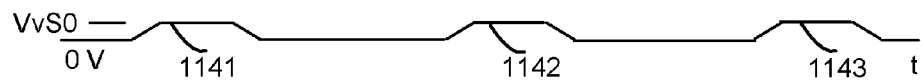

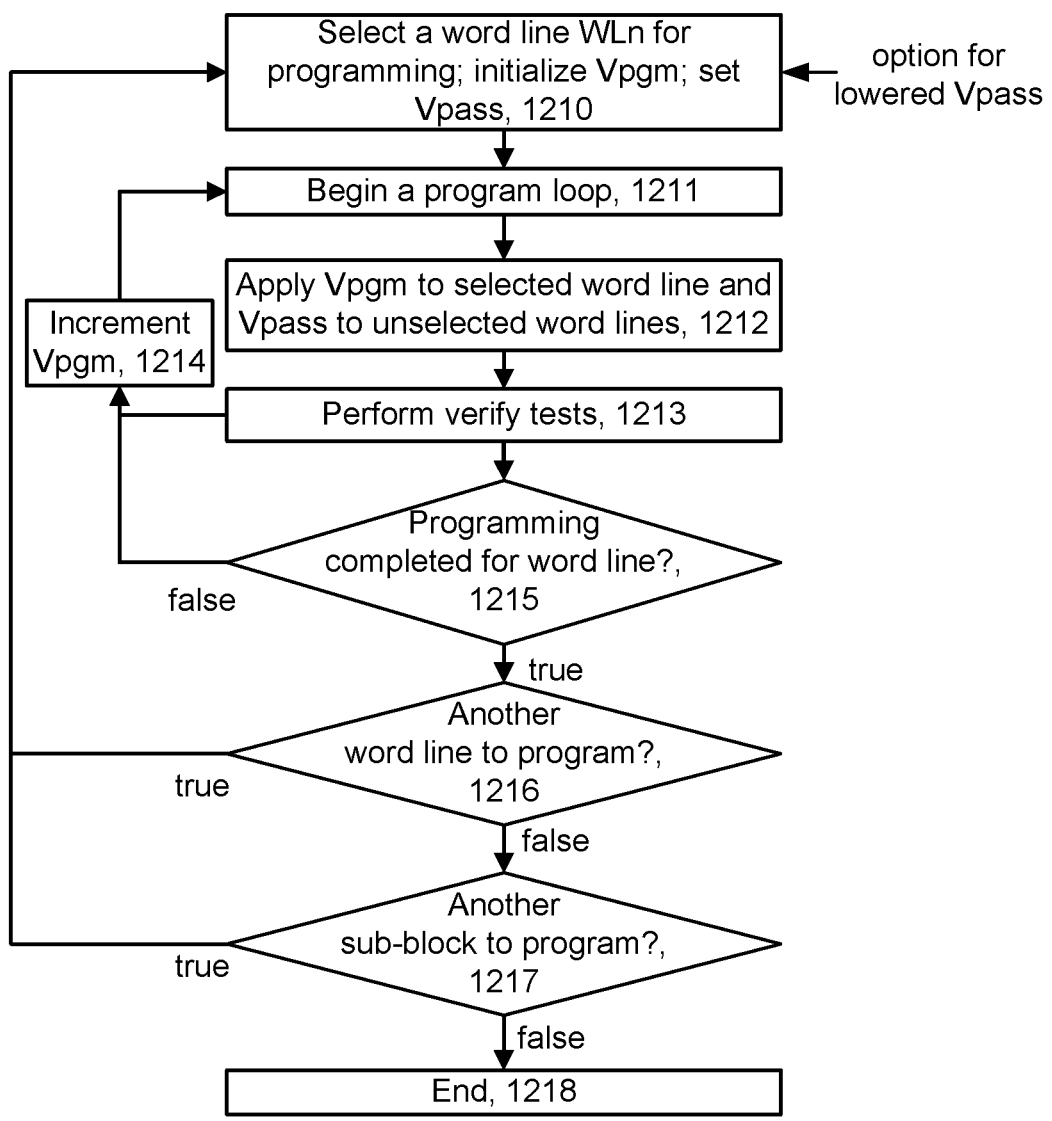

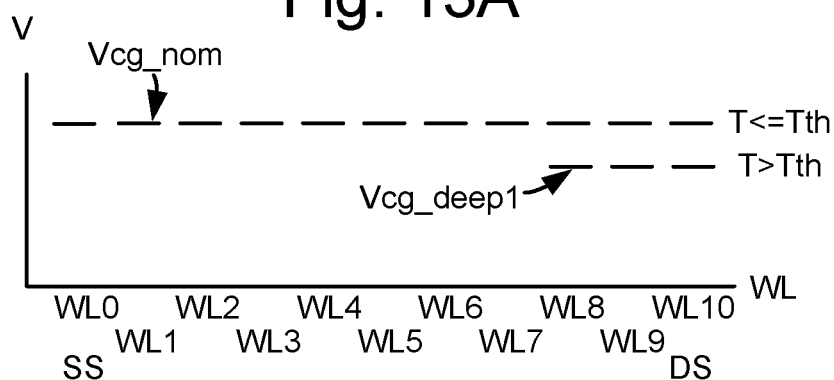
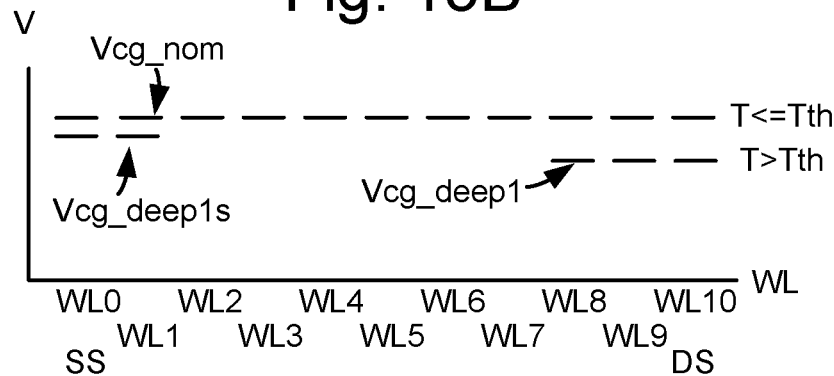
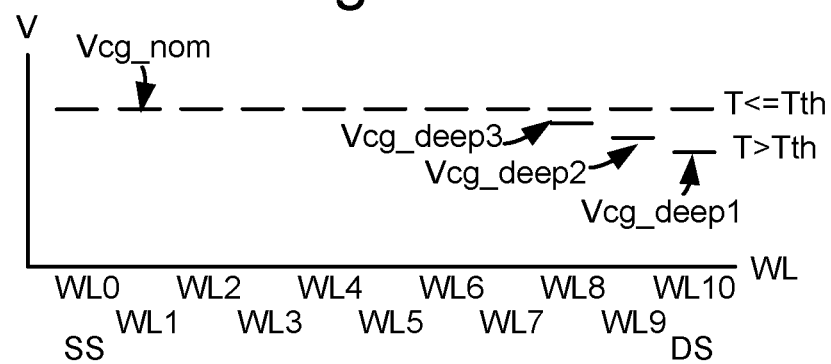

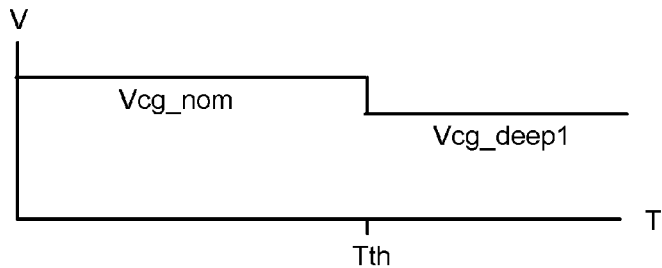
Fig. 13D
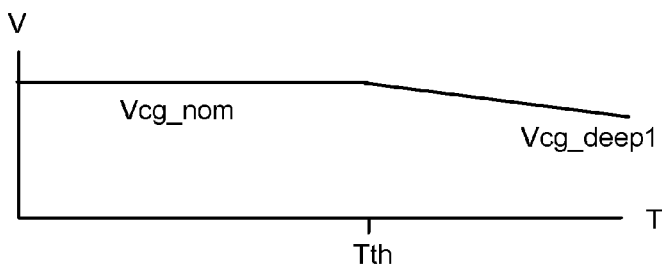
Fig. 13E1
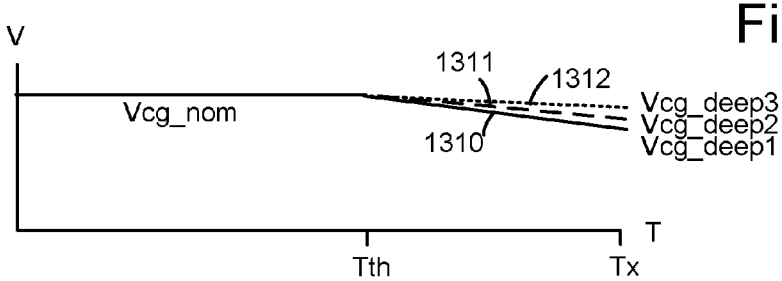
Fig. 13E2
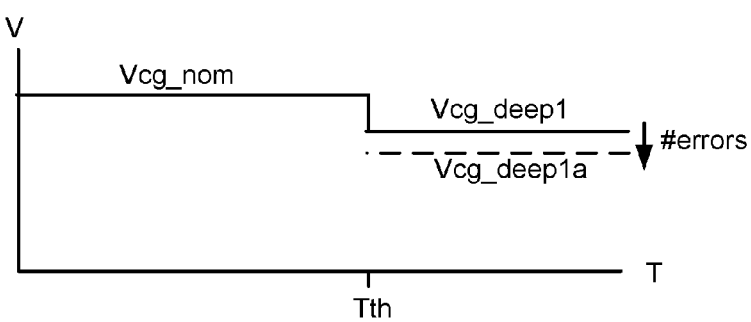
Fig. 13F
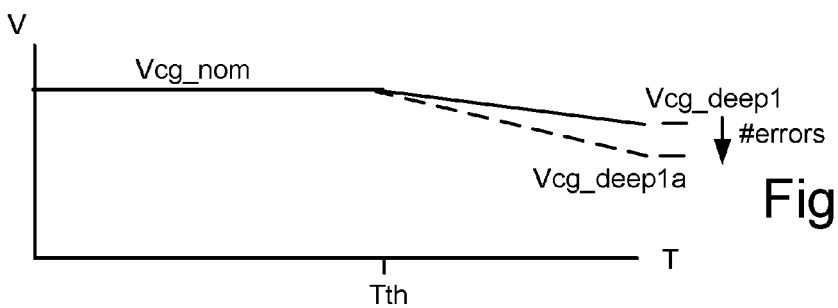
Fig. 13G

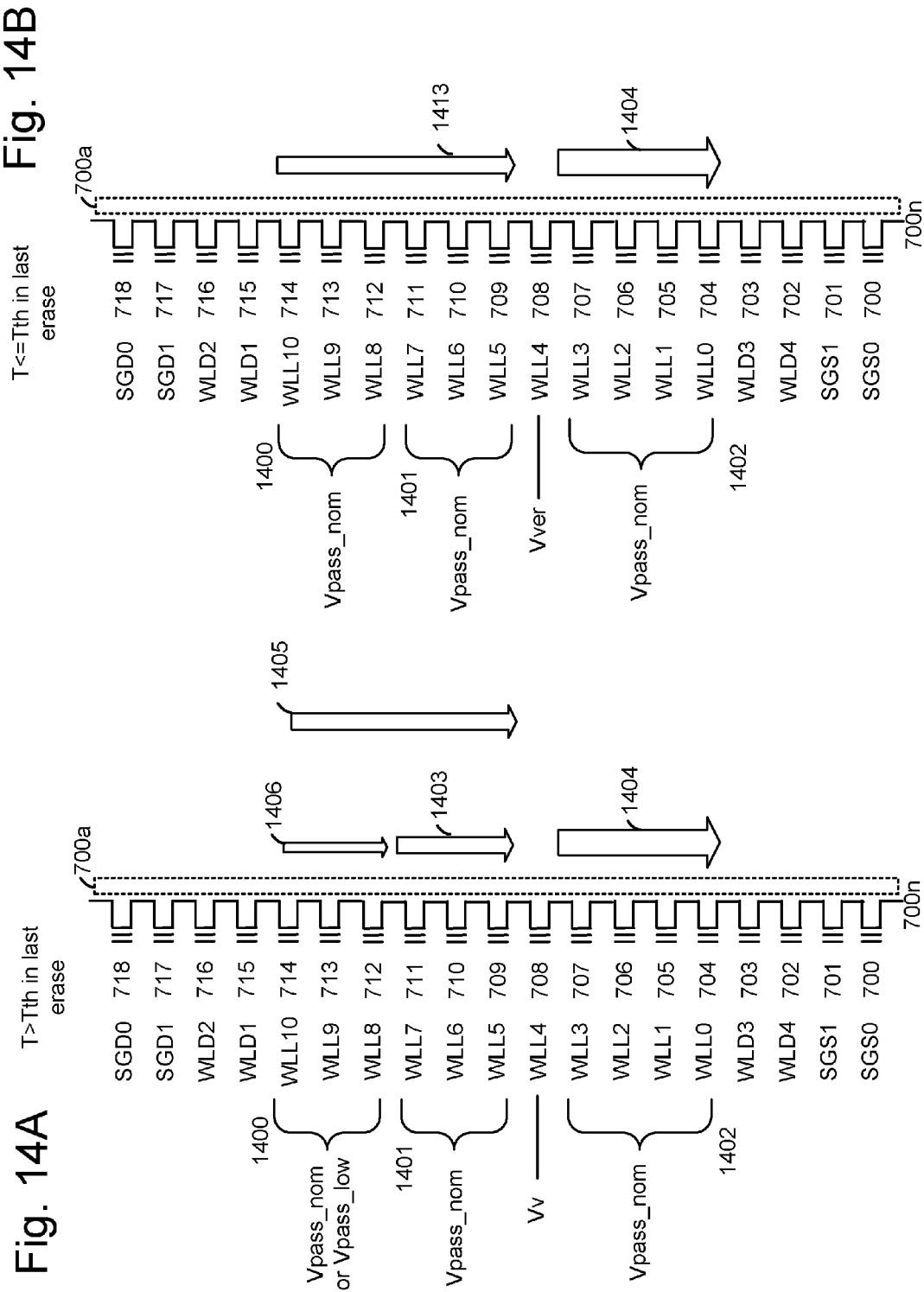

WORD LINE-DEPENDENT AND TEMPERATURE-DEPENDENT ERASE DEPTH

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in strings, for instance, where select gate transistors are provided at the ends of the string to selectively connect a channel of the string to a source line or bit line. However, various challenges are presented in operating such memory devices.

BRIEF DESCRIPTION OF THE DRAWINGS

FIG. 2A depicts blocks of memory cells in an example 2D configuration of the memory structure 126 of FIG. 1A.

FIG. 3 is a perspective view of a memory device 600 comprising a set of blocks in an example 3D configuration of the memory structure 126 of FIG. 1A.

FIG. 6 depicts a close-up view of the region 622 of the stack of FIG. 4.

FIG. 7A depicts an example view of NAND strings in sub-blocks in a 3D configuration which is consistent with FIG. 4.

FIG. 8E depicts example Vth distributions of memory cells with and without program disturb, and without data retention loss, where eight data states are used.

FIG. 8F depicts the example Vth distributions of FIG. 8E with program disturb, with and without data retention loss.

FIG. 8G depicts an alternative to the example Vth distributions of FIG. 8E, where the erase state is more deeply erased.

FIG. 11A depicts example voltages in an erase operation which uses gate-induced drain leakage (GIDL) to charge up the channel of a NAND string.

FIG. 11B depicts an example channel voltage consistent with FIG. 11A.

FIG. 11C depicts example erase voltages in an erase operation which applies a positive voltage to a p-well of a substrate.

FIG. 11D depicts example erase voltages in an erase operation which applies a negative voltage to the word lines in a block.

FIG. 11E depicts example verify voltages in an erase operation.

FIG. 12B depicts an example process for programming memory cells, as an example of step 1200, 1206 or 1208 of FIG. 12A.

FIG. 13A depicts an example plot showing control gate voltages versus word line position in an erase operation, where two control gate voltages are available for drain-side word lines based on temperature.

FIG. 13B depicts an example plot showing control gate voltages versus word line position in an erase operation, where two control gate voltages are available for drain-side word lines and source-side word lines based on temperature.

FIG. 13C depicts an example plot showing control gate voltages versus word line position in an erase operation, where gate voltages decrease progressively with decreasing distance to the drain-end of the string based on temperature.

FIG. 13D depicts an example plot of control gate voltages versus temperature in an erase operation, where the control gate voltage is stepped down from Vcg_nom to Vcg_deep1 when T>Tth.

FIG. 13E1 depicts an example plot of control gate voltage versus temperature in an erase operation, where the control gate voltage is set based on a ramp from Vcg_nom to Vcg_deep1 as a function of T when T>Tth.

FIG. 13E2 depicts an example plot of control gate voltage versus temperature in an erase operation, where the control gate voltage is set based on different ramps for different word lines as a function of T when T>Tth.

FIG. 13F depicts an example plot of control gate voltages versus temperature in an erase operation, where the control gate voltage is stepped down from Vcg_nom to a value between Vcg_deep1 and Vdeep1a as a function of a number of errors, when T>Tth.

FIG. 13G depicts an example plot of control gate voltages versus temperature in an erase operation, where the control gate voltage is set based on a ramp from Vcg_nom to a value between Vcg_deep1 and Vdeep1a as a function of a number of errors and as a function of T, when T>Tth.

FIG. 14A depicts resistance in a NAND string during sensing of a verify test in a program operation, where T>Tth in the last erase operation, and Vpass_nom or Vpass_low is applied to one or more drain side word lines.

FIG. 14B depicts resistance in a NAND string during sensing of a verify test in a program operation, where T<=Tth in the last erase operation, and Vpass_nom is applied to one or more drain side word lines.

DETAILED DESCRIPTION

Techniques are provided for reducing the effects of program disturb in a memory device. A corresponding memory device is also provided.

In some memory devices, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control line (e.g., word line) which acts a control gate. A set of word lines extends from the source side of a block to the drain side of a block. Memory cells can be connected in other types of strings and in other ways as well.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in channel gradient.

Figure 9:
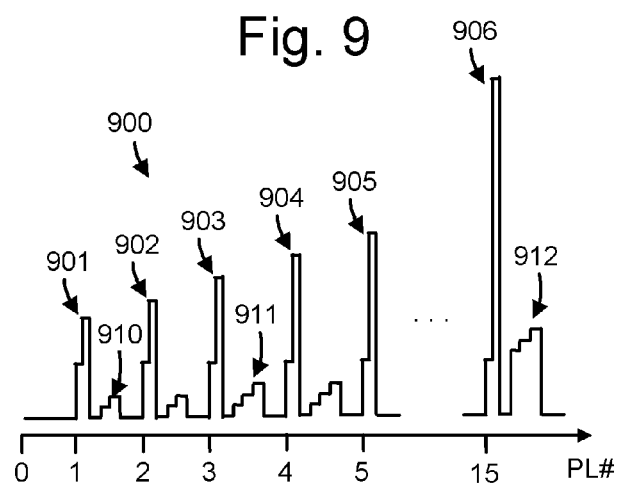
FIG. 9 depicts a waveform of an example programming operation.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 9. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells in one sub-block, or portion of a block, are programmed before programming memory cells in another sub-block.

Each memory cell may be associated with a data state according to write data in a program command. Based on its data state, a memory cell will either remain in the erased state or be programmed to a programmed data state. For example, in a one bit per cell memory device, there are two data states including the erased state (Eslc) and the programmed data state (Pslc) (see FIG. 8A). In a two-bit per cell memory device, there are four data states including the erased state and three higher data states referred to as the A, B and C data states (see FIG. 8B). In a three-bit per cell memory device, there are eight data states including the erased state and seven higher data states referred to as the A, B, C, D, E, F and G data states (see FIG. 8C). In a four-bit per cell memory device, there are sixteen data states including the erased state and fifteen higher data states. The data states may be referred to as the S0, S1, S2, S3, S4, S5, S6, S7, S8, S9, S10, S11, S12, S13, S14 and S15 data states (see FIG. 8D) where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states.

However, memory cells can be inadvertently programmed when the program voltage is applied. For example, a memory cell connected to a selected word line in a selected or unselected string, or to an unselected word line, can be inadvertently programmed. Inadvertent programming, or program disturb, can be caused by capacitive coupling from one or more word lines to one or more memory cells. For example, memory cells of the unselected NAND strings can be disturbed by voltages applied to word lines which are shared by the unselected NAND strings and the selected NAND strings. Memory cells which are to remain in the erased state based on the write data are most susceptible to program disturb. Program disturb increases their threshold voltage (Vth) and can result in a read error. To reduce program disturb, the channel of the unselected NAND string is boosted before the program voltage is applied. The boosting is primary provided by an increase in pass voltages (Vpass) of the unselected word lines, e.g., from 0 V to 8-10 V. This increase is coupled to the channel. Moreover, the select gate transistors at each end of the unselected NAND string are provided in a non-conductive state so that the channel voltages can float higher due to the capacitive coupling.

Memory cells at the drain-side edge of a string are especially susceptible to program disturb due to a reduced channel boosting. One reason is the word line programming order of a block. Typically, the source-side word line is programmed first and programming proceeds one word line at a time until the drain side word line is reached. At this time, the memory cells of all of the previous word lines have been programmed. Portions of the channel adjacent to the programmed memory cells have a reduced channel boosting compared to portions of the channel adjacent to erased memory cells, because the channel boosting is based on the gate voltage minus the Vth. Another reason is that the channel boosting is only on the source side of the memory cells at the drain-side edge. In contrast, the channel boosting is on the source and drain sides of the other memory cells which are not at the edge of the block.

One approach to reduce program disturb is to provide a deeper erase so that there is a wider margin between the Vth distribution of the erased state cells and the cells in the lowest programmed data state. However, this worsens short-term data retention. Programmed cells tend to lose charge shortly after being programmed. This results in a downshift in the lower tail of the Vth distribution. See FIG. 8F. Moreover, the amount of charge loss of a cell is proportional to the increase in the Vth of the cell during programming. When the erase is deeper, the amount of charge loss is greater.

It has been observed that program disturb becomes worse for the drain-side memory cells at higher temperatures, while short term data retention generally does not become worse at higher temperatures.

Techniques provided herein address the above and other issues by providing an optimum balance between combating program disturb and data retention loss. In one aspect, a deeper erase is provided for drain-side memory cells when the temperature is relatively high, to reduce program disturb. In another aspect, the verify levels of the programmed data states are lowered to reduce data retention loss when the temperature is relatively high. In another aspect, the number of read errors is used to adjust the depth of the depth of the erase operation. In another aspect, a pass voltage of a drain-side cell is lowered during a verify test for another cell to counteract the reduced channel resistance caused by the deep erase of the drain-side cell.

Various other features and benefits are described below.

Figure 1A:
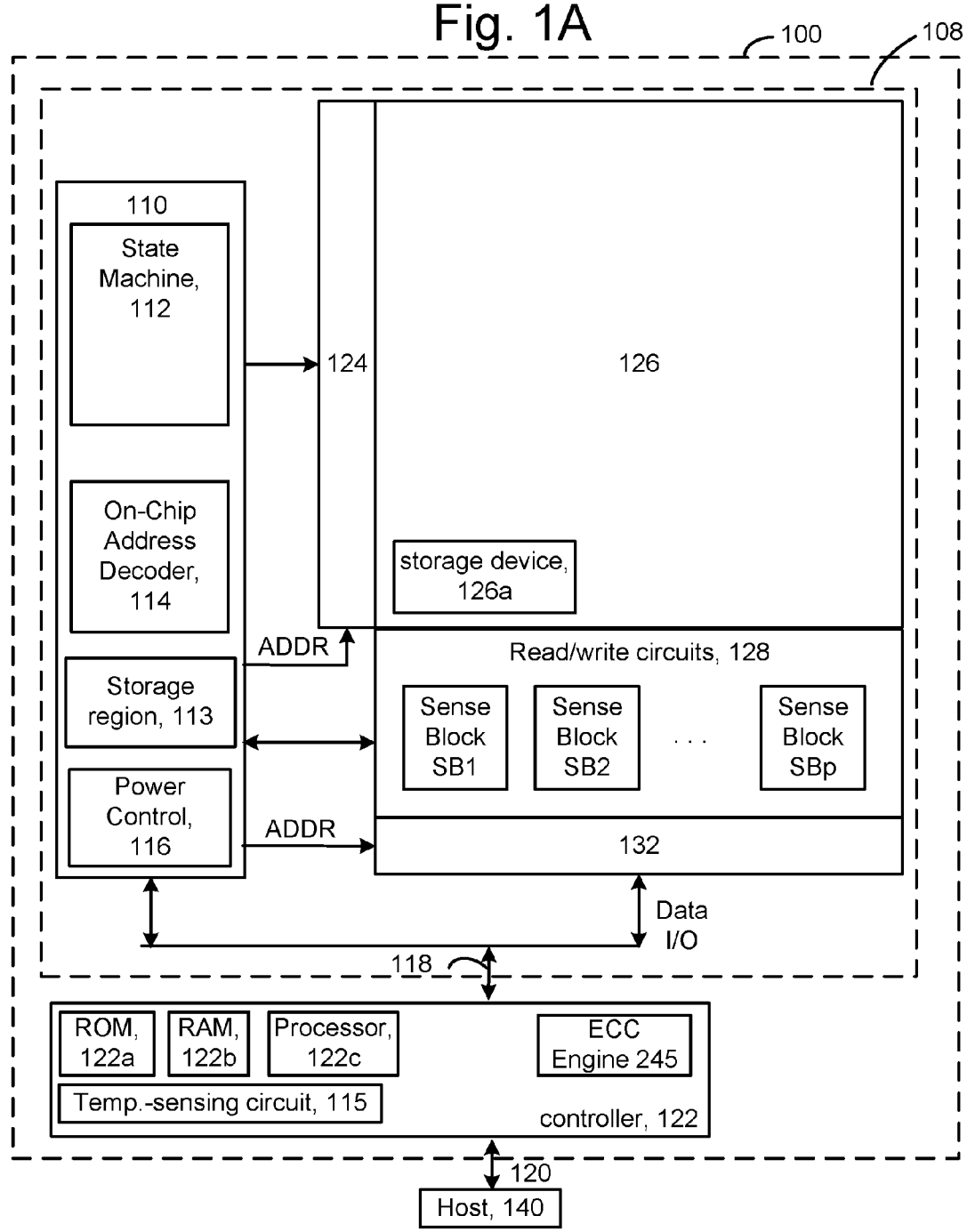
FIG. 1A is a block diagram of an example memory device.

FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided, e.g., for erase, program and read parameters as described further below. The storage region may store an indication of whether a last erase operation occurred under a high temperature, e.g., where the ambient temperature exceeds a threshold. This indication may be used to adjust an erase depth, or a pass voltage used during a verify test of a program operation, as described further below. The storage region may store an indication of the temperature.

The on-chip address decoder 114 provides an address interface between that used by the host or a memory controller to the hardware address used by the decoders 124 and 132. The power control module 116 controls the power and voltages supplied to the word lines, select gate lines and bit lines during memory operations. It can include drivers for word lines, SGS and SGD transistors and source lines. See FIG. 15. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the techniques described herein. For example, a control circuit may include any one of, or a combination of, control circuitry 110, state machine 112, decoders 114 and 132, power control module 116, sense blocks SBb, SB2, . . . , SBp, read/write circuits 128, controller 122, and so forth.

The off-chip controller 122 may comprise a processor 122c, storage devices (memory) such as ROM 122a and RAM 122b and an error-correction code (ECC) engine 245. The ECC engine can correct a number of read errors which are caused, e.g., when the upper tail of a Vth distribution becomes too high. The ECC engine may be used to count of number of errors in a read operation and use this number to determine whether to perform a deep erase, or set a depth of an erase, as discussed further below.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein.

The controller 122 may also include a temperature-sensing circuit 115 which is used by the processor 122c to set temperature-based parameters such as the control gate voltage during an erase operation. For example, the controller may provide a digital signal to the power control module 116 to set a control gate voltage in response to a temperature indicated by an output of the temperature-compensation circuit. See also FIG. 1B.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 1B:
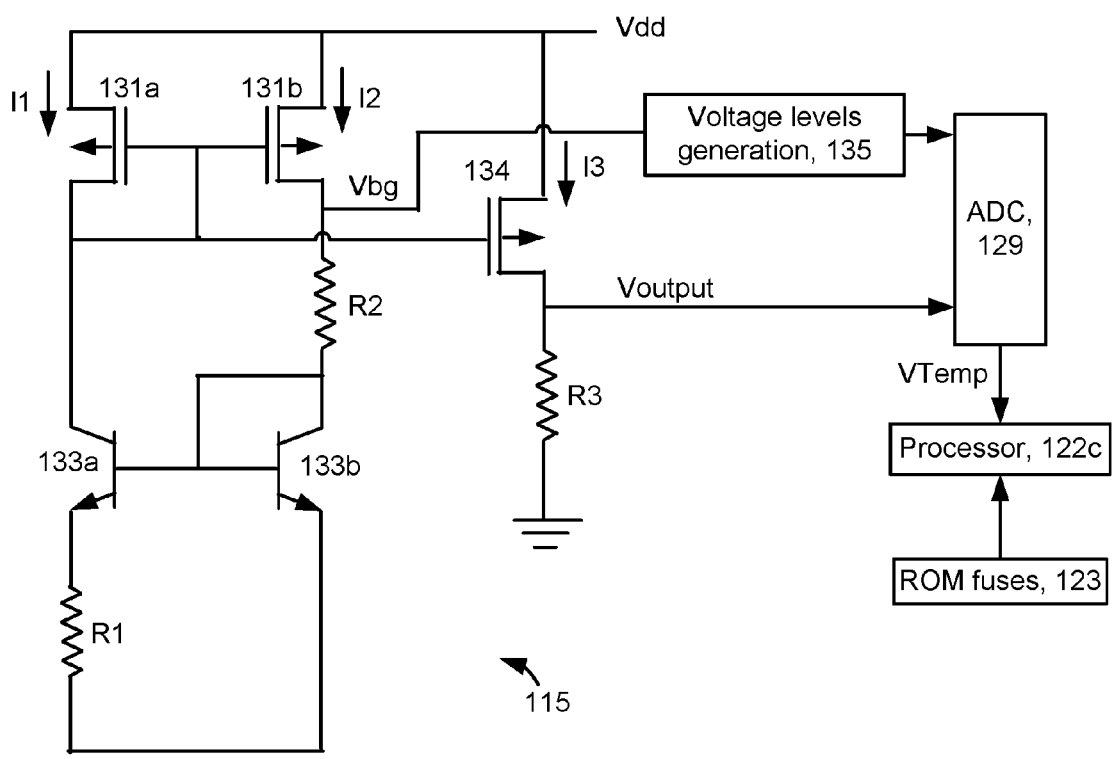
FIG. 1B depicts an example of the temperature-sensing circuit 115 of FIG. 1B.

FIG. 1B depicts an example of the temperature-sensing circuit 115 of FIG. 1A. The circuit includes pMOSFETs 131$a$, 131$b$ and 134, bipolar transistors 133$a$ and 133$b$ and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor. This is data indicating a temperature of the memory device. ROM fuses 123 store data which correlates the matching voltage level to a temperature, in one approach. The processor then uses the temperature to set temperature-based parameters in the memory device.

Vbg, is obtained by adding the base-emitter voltage (Vbe) across the transistor 131$b$ and the voltage drop across the resistor R2. The bipolar transistor 133$a$ has a larger area (by a factor N) than the transistor 133$b$. The PMOS transistors 131$a$ and 131$b$ are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131$a$ and 131$b$ and the current through the transistor 134 mirrors the current through the transistors 131$a$ and 131$b$.

FIG. 2A depicts blocks of memory cells in an example 2D configuration of the memory structure 126 of FIG. 1. The memory array can include many blocks. Each example block 200, 210 includes a number of NAND strings and respective bit lines, e.g., BL0, BL1, . . . which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line 220. Sixteen word lines, for example, WL0-WL15, extend between the source select gates and the drain select gates. In some cases, dummy word lines, which contain no user data, can also be used in the memory array adjacent to the select gate transistors. Such dummy word lines can shield the edge data word line from certain edge effects.

One type of non-volatile memory which may be provided in the memory array is a floating gate memory. Other types of non-volatile memory can also be used. For example, a charge-trapping memory cell may use a non-conductive dielectric material in place of a conductive floating gate to store charge in a non-volatile manner. In an example, a triple layer dielectric formed of silicon oxide, silicon nitride and silicon oxide ("ONO") is sandwiched between a conductive control gate and a semiconductor. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 2B:
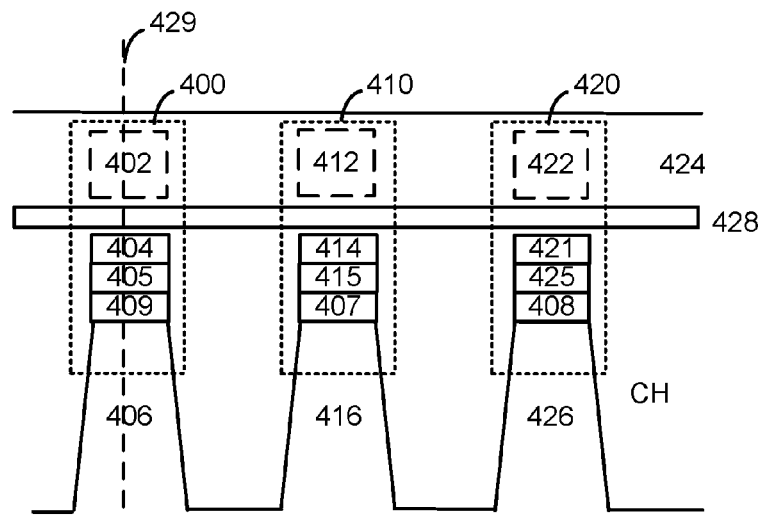
FIG. 2B depicts a cross-sectional view of example charge-trapping memory cells in NAND strings, as an example of memory cells in FIG. 2A.

FIG. 2B depicts a cross-sectional view of example charge-trapping memory cells in NAND strings, as an example of memory cells in FIG. 2A. The view is in a word line direction of memory cells comprising a flat control gate and charge-trapping regions as a 2D example of memory cells in the memory structure 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line (WL) 424 extends across NAND strings which include respective channel regions 406, 416 and 426. Portions of the word line provide control gates 402, 412 and 422. Below the word line is an IPD layer 428, charge-trapping layers 404, 414 and 421, polysilicon layers 405, 415 and 425 and tunneling layer layers 409, 407 and 408. Each charge-trapping layer extends continuously in a respective NAND string.

A memory cell 400 includes the control gate 402, the charge-trapping layer 404, the polysilicon layer 405 and a portion of the channel region 406. A memory cell 410 includes the control gate 412, the charge-trapping layer 414, a polysilicon layer 415 and a portion of the channel region 416. A memory cell 420 includes the control gate 422, the charge-trapping layer 421, the polysilicon layer 425 and a portion of the channel region 426.

One advantage of a flat control gate is that the charge-trapping layer can be made thinner than a floating gate. Additionally, the memory cells can be placed closer together.

Figure 2C:
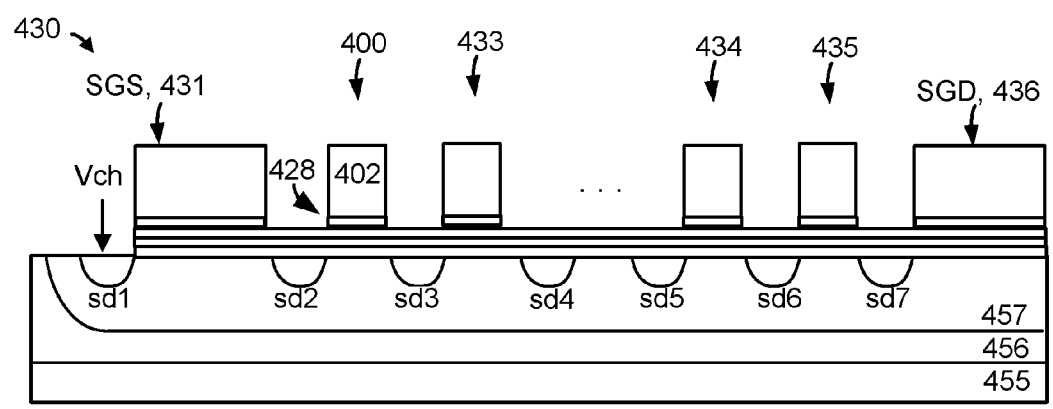
FIG. 2C depicts a cross-sectional view of the structure of FIG. 2B along line 429.

FIG. 2C depicts a cross-sectional view of the structure of FIG. 2B along line 429. The view shows a NAND string 430 having a flat control gate and a charge-trapping layer. The NAND string 430 includes an SGS transistor 431, example memory cells 400, 433, . . . , 434 and 435, and an SGD transistor 436.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well 457. A channel voltage, Vch, may be applied directly to the channel region of the substrate. The memory cell 400 includes the control gate 402 and the IPD layer 428 above the charge-trapping layer 404, the polysilicon layer 405, the tunneling layer 409 and the channel region 406.

The control gate layer may be polysilicon and the tunneling layer may be silicon oxide, for instance. The IPD layer can be a stack of high-k dielectrics such as AlOx or HfOx which help increase the coupling ratio between the control gate layer and the charge-trapping or charge storing layer. The charge-trapping layer can be a mix of silicon nitride and oxide, for instance.

The SGD and SGS transistors have the same configuration as the memory cells but with a longer channel length to ensure that current is cutoff in an inhibited NAND string.

In this example, the layers 404, 405 and 409 extend continuously in the NAND string. In another approach, portions of the layers 404, 405 and 409 which are between the control gates 402, 412 and 422 can be removed, exposing a top surface of the channel 406.

FIG. 3 is a perspective view of a memory device 600 comprising a set of blocks in an example 3D configuration of the memory structure 126 of FIG. 1A. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 4:
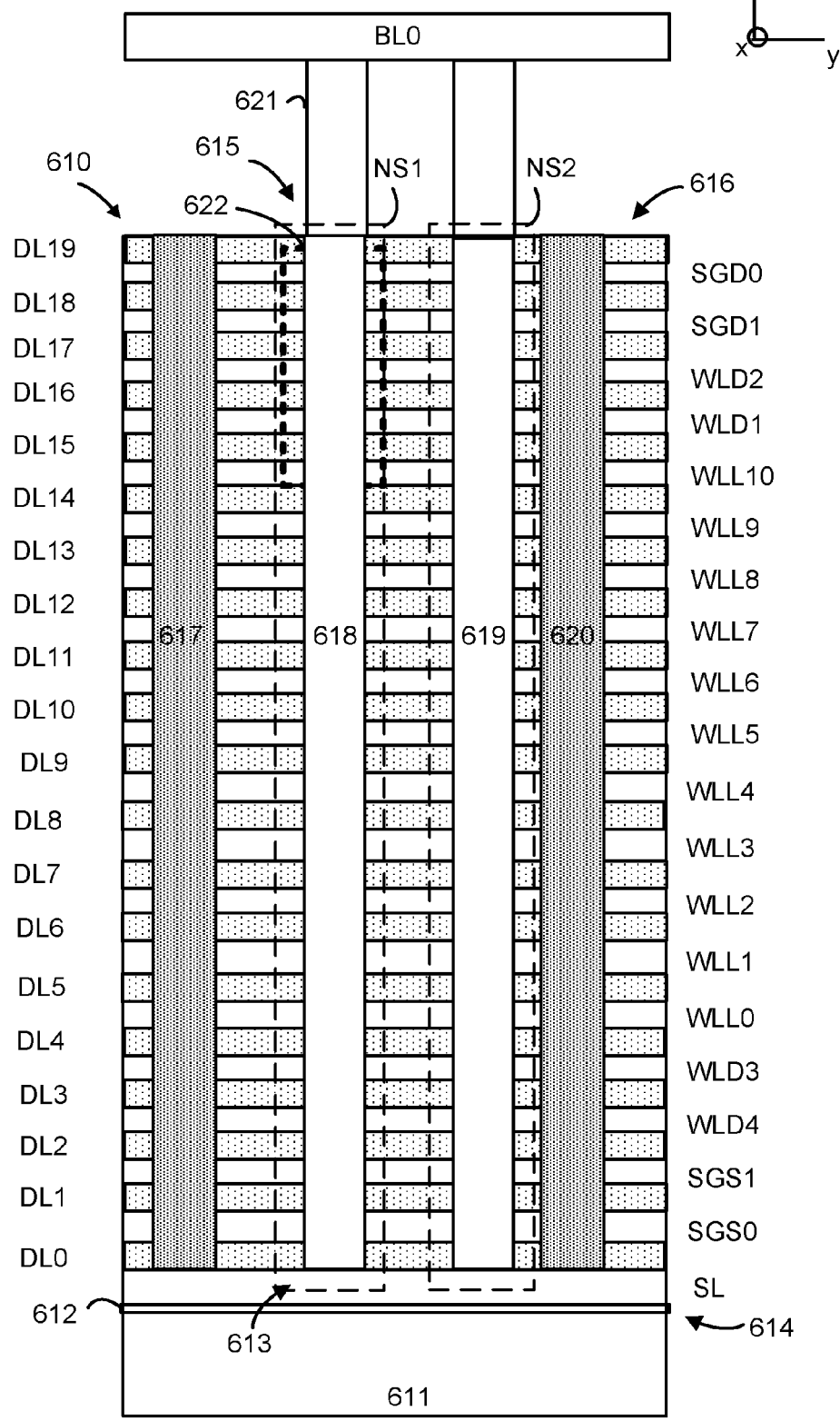
FIG. 4 depicts an example cross-sectional view of a portion of one of the blocks of FIG. 5.
Figure 5:
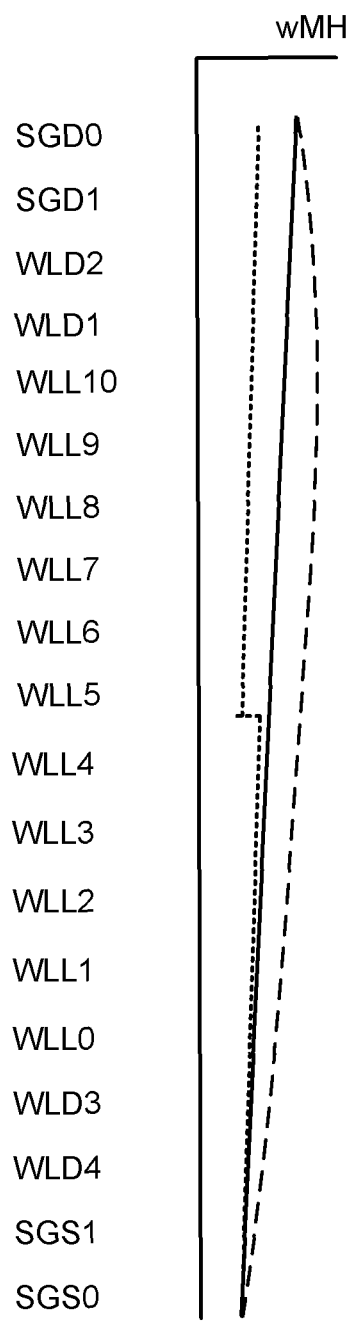
FIG. 5 depicts a plot of memory hole diameter in the stack of FIG. 4.

FIG. 4 depicts an example cross-sectional view of a portion of one of the blocks of FIG. 5. The block comprises a stack 610 of alternating conductive and dielectric layers. In this example, the conductive layers comprise two SGD layers, two SGS layers and four dummy word line layers (or word lines) WLD1, WLD2, WLD3 and WLD4, in addition to data word line layers (or word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

FIG. 5 depicts a plot of memory hole diameter in the stack of FIG. 4. The vertical axis is aligned with the stack of FIG. 4 and depicts a width (wMH), e.g., diameter, of the pillars formed by materials in the memory holes 618 and 619. In such a memory device, the memory holes which are etched through the stack have a very high aspect ratio. For example, a depth-to-diameter ratio of about 25-30 is common. The memory holes may have a circular cross-section. Due to the etching process, the memory hole and resulting pillar width can vary along the length of the hole. Typically, the diameter becomes progressively smaller from the top to the bottom of the memory hole (solid line in FIG. 5). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (long dashed line in FIG. 5). For example, the memory hole width is a maximum at the level of WL9 in the stack, in this example. The memory hole width is slightly smaller at the level of WL10, and progressively smaller at the levels of WL8 to WL0.

Due to the non-uniformity in the diameter of the memory hole and pillar, the programming and erase speed of the memory cells can vary based on their position along the memory hole. With a relatively smaller diameter portion of a memory hole, the electric field across the tunnel oxide is relatively stronger, so that the programming and erase speed is higher.

In another possible implementation, represented by the short dashed line, the stack is fabricated in two tiers. The stack can be fabricated in two or more tiers. The bottom tier is formed first with a respective memory hole. The top tier is then formed with a respective memory hole which is aligned with the memory hole in the bottom tier. Each memory hole is tapered such that a double tapered memory hole is formed in which the width increases, then decreases and increases again, moving from the bottom of the stack to the top.

FIG. 6 depicts a close-up view of the region 622 of the stack of FIG. 4. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole) can include a charge-trapping layer 663 or film such as SiN or other nitride, a tunneling layer 664, a channel 665 (e.g., comprising polysilicon), and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In another approach, the blocking oxide is in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to (e.g., with an increase in) the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

FIG. 7A depicts an example view of NAND strings in sub-blocks in a 3D configuration which is consistent with FIG. 4. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 4. In a block BLK, each sub-block comprises a set of NAND strings which extend in the x direction and which have a common SGD line. The NAND strings 700n, 710n, 720n and 730n are in sub-blocks SB0, SB1, SB2 and SB3, respectively. Programming of the block may occur one sub-block at a time, e.g., SB0 first, followed by SB1, then SB2 and then SB3. Within each sub-block, a word line programming order may be followed, e.g., starting at WL0, the source-side word line and proceeding one word line at a time to WLL10, the drain-side word line.

The NAND strings 700n, 710n, 720n and 730n have channel regions 700a, 710a, 720a and 730a, respectively.

Additionally, NAND string 700n includes SGS transistors 700 and 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710n includes SGS transistors 720 and 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720n includes SGS transistors 740 and 741, dummy memory cells 742 and 743, data memory cells 744, 745, 746, 747, 748, 749, 750, 751, 752, 753 and 754, dummy memory cells 755 and 756, and SGD transistors 757 and 758.

NAND string 730n includes SGS transistors 760 and 761, dummy memory cells 762 and 763, data memory cells 764, 765, 766, 767, 768, 769, 770, 771, 772, 773 and 774, dummy memory cells 775 and 776, and SGD transistors 777 and 778.

This figures shows a set of word lines (WL0-WL10). A selected string (700n) comprises a set of data memory cells 704-714 extending from a group 700s of one or more (e.g., two in this example) source-side word lines WLL0 and WLL1 at a source-side 700ss of the selected string to group 700d of one or more (e.g., three) drain-side data word lines WLL8-WLL10 at a drain-side 700ds of the selected string. Intermediate word lines 700i are between the source-side word lines and the drain-side word lines. An unselected string (710n) of data memory cells 724-734 extends from the group of one or more source-side data word lines to the drain-side data word line. Each word line in the set of word lines is connected to a respective data memory cell in the selected string and to a respective data memory cell in the unselected string. Also, the set of data memory cells 704-714 extends from a group 700g1 of one or more (e.g., two in this example) source-side data memory cells 704 and 705 at the source-side 700ss of the selected string to a group 700g2 of one or more drain-side data memory cells 712-714 at the drain-side 700ds of the selected string. A group of intermediate memory cells 700g3 are between the one or more drain-side memory cells and the one or more source-side memory cells.

Figure 7B:
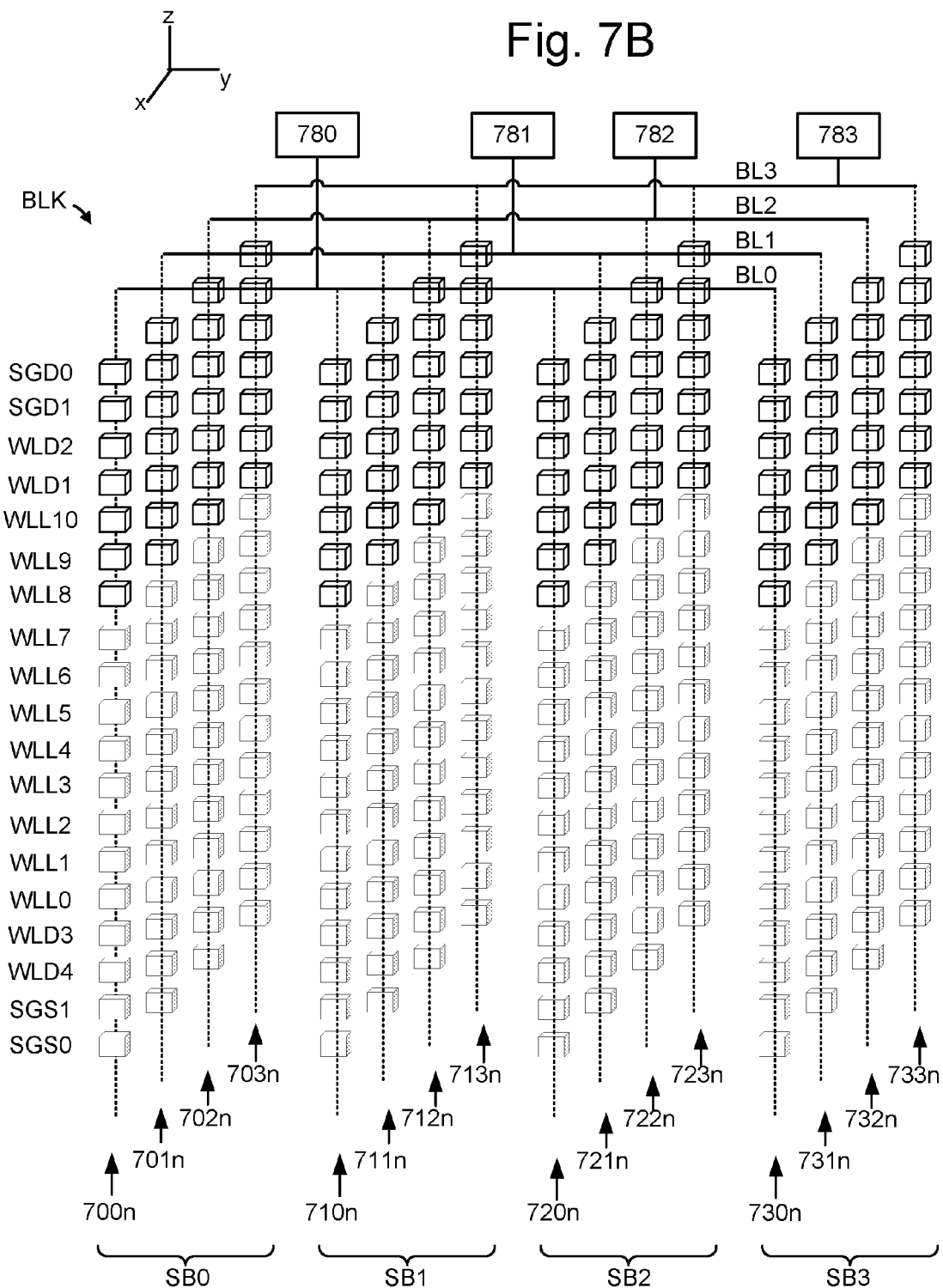
FIG. 7B depicts additional detail of the sub-blocks SB0-SB3 of FIG. 8A.

FIG. 7B depicts additional detail of the sub-blocks SB0-SB3 of FIG. 7A. Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. Sensing circuitry may be connected to each bit line. For example, sensing circuitry 780, 781, 782 and 783 is connected to bit lines BL0, BL1, BL2 and BL3.

Figure 8A:
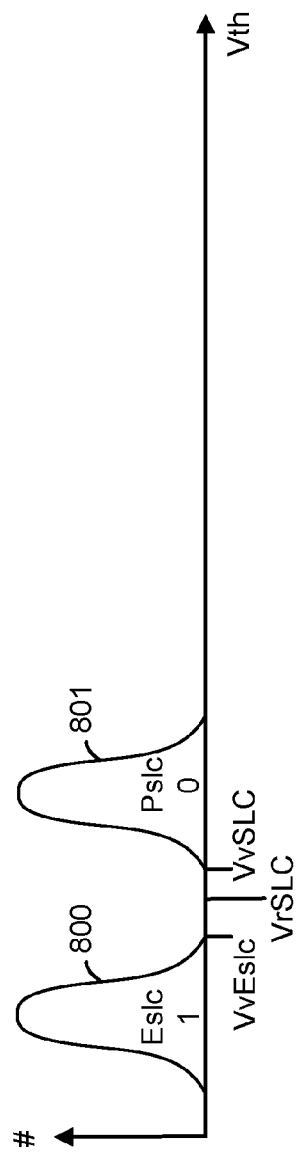
FIG. 8A depicts example Vth distributions of memory cells, where two data states are used.

FIG. 8A depicts example Vth distributions of memory cells, where two data states are used. During a programming operation, the final Vth distribution can be achieved by using one or more programming passes. Each pass may use incremental step pulse programming, for instance. During a programming pass, program-verify iterations are performed for a selected word line. A program-verify iteration comprises a program portion in which a program voltage is applied to the word line followed by a verify portion in which one or more verify tests are performed. Each programmed data state has a verify voltage which is used in the verify test for the state.

A Vth distribution 800 represents an erased state (Eslc) and a Vth distribution 801 represents a programmed data state (Pslc), in an example of single-level cell (SLC) programming. The erased state may represent a one bit while the programmed data state represents a zero bit, for example. A verify voltage for the programmed data state is VvSLC and a read voltage for distinguishing between the two states is VrSLC. Generally, a read voltage for distinguishing between adjacent states, e.g., a lower state and a higher state, should be located midway between the expected upper tail of the Vth distribution of the lower state and the expected lower tail of the Vth distribution of the higher state.

Figure 8B:
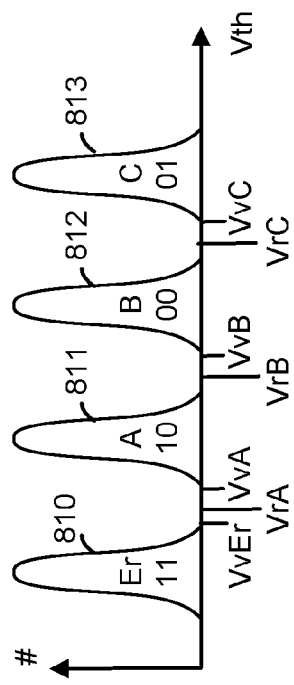
FIG. 8B depicts example Vth distributions of memory cells, where four data states are used.

FIG. 8B depicts example Vth distributions of memory cells, where four data states are used. The data states are represented by Vth distributions 810, 811, 812 and 813 for the Er, A, B and C states, respectively, and an example encoding of bits for each state is 11, 10, 00 and 01, respectively, in the format of upper page (UP) bit/lower page (LP) bit. The verify voltages are VvA, VvB and VvC, and the read voltages are VrA, VrB and VrC. A LP read may use VrA and VrC and an UP read may use VrB.

Figure 8C:
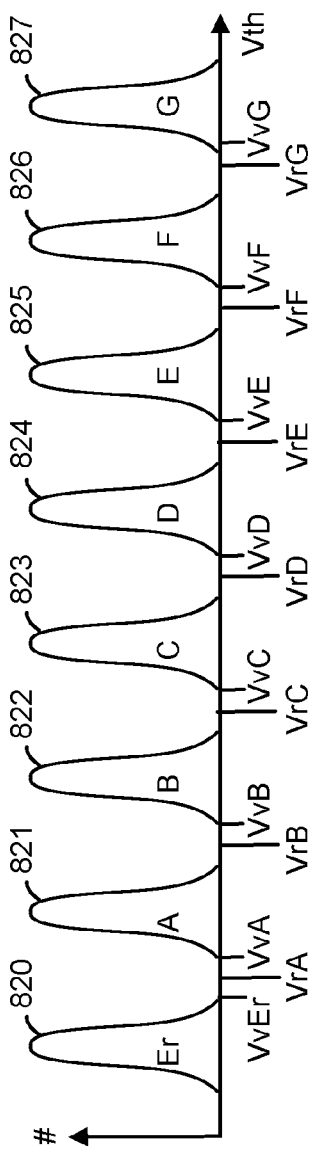
FIG. 8C depicts example Vth distributions of memory cells, where eight data states are used.

FIG. 8C depicts example Vth distributions of memory cells, where eight data states are used. The verify voltages of the A, B, C, D, E, F and G states are VvA, VvB, VvC, VvD, VvE, VvF and VvG, respectively. A first set of read voltages for the A, B, C, D, E, F and G states includes VrA, VrB, VrC, VrD, VrE, VrF and VrG, respectively. For the A, B, C, D, E, F and G states, an example encoding of bits for each state is 111, 110, 100, 000, 010, 011, 001 and 101, respectively. The data states are represented by Vth distributions 820, 821, 822, 823, 824, 825, 826 and 827 for the Er, A, B, C, D, E, F and G states, respectively.

Figure 8D:
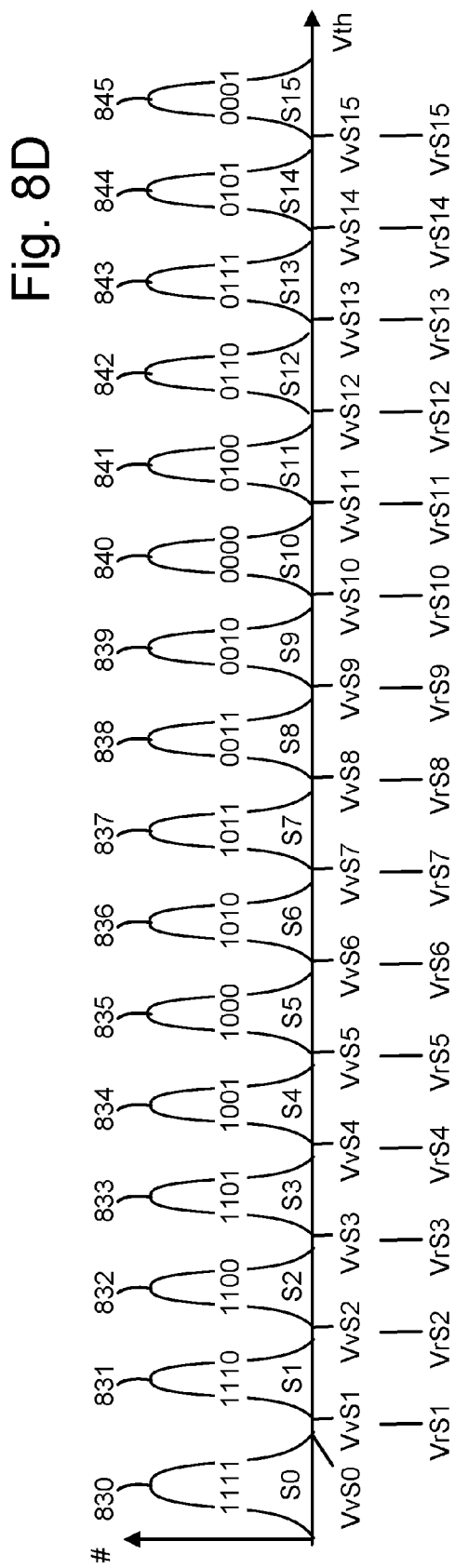
FIG. 8D depicts example Vth distributions of memory cells, where sixteen data states are used.

FIG. 8D depicts example Vth distributions of memory cells, where sixteen data states are used. Programming using four bits per cell (16 levels) can involve lower, lower-middle, upper-middle and upper pages.

The data states are represented by Vth distributions 830, 831, 832, 833, 834, 835, 836, 837, 838, 839, 840, 841, 842, 843, 844 and 845 for the S0, S1, S2, S3, S4, S5, S6, S7, S8, S9, S10, S11, S12, S13, S14 and S15 states, respectively, and an example encoding of bits for each state is 1111, 1110, 1100, 1101, 1001, 1000, 1010, 1011, 0011, 0010, 0000, 0100, 0110, 0111, 0101 and 0001, respectively, in the format of upper page (UP) bit/upper middle (UMP) page bit, lower middle (LMP) page bit, lower page (LP) bit, as depicted. The verify voltages are VvS1, VvS2, VvS3, VvS4, VvS5, VvS6, VvS7, VvS8, VvS9, VvS10, VvS11, VvS12, VvS13, VvS4 and VvS15. The read voltages are VrS1, VrS2, VrS3, VrS4, VrS5, VrS6, VrS7, VrS8, VrS9, VrS10, VrS11, VrS12, VrS13, VrS4 and VrS15.

ALP read may use VrS1, VrS3, VrS5, VrS7, VrS9 and VrS13. A LMP read may use VrS2, VrS6, VrS10, VrS12 and VrS14. An UMP read may use VrS4, VrS11 and VrS15. An UP read may use VrS8.

FIG. 8E depicts example Vth distributions of memory cells with and without program disturb, and without data retention loss, where eight data states are used. The Vth distributions from FIG. 8C are repeated and represent the case of no program disturb. The Vth distributions 820a, 821a, 822a, 823a, 824a and 825a for the Er, A, B, C, D and E states, respectively, represent the case of program disturb. The amount of program disturb is greater for the lower states. The F and G states are considered to have essentially no program disturb, in this example.

FIG. 8F depicts the example Vth distributions of FIG. 8E with program disturb, with and without data retention loss. The Vth distributions 820a, 821a, 822a, 823a, 824a, 825a, 826 and 827 from FIG. 8C are repeated. The Vth distributions 821b, 822b, 823b, 824b, 825b, 826b and 827b for the A, B, C, D, E, F and G states, respectively, represent the case of data retention loss. The amount of data retention loss is greater for the higher states because the cells in the higher states have experienced a larger change in Vth during programming than the cells in the lower states. Short-term data retention loss of a cell is proportional to the total Vth swing from the erased state to the programmed data state of the cell. A deeper erase leads to a larger Vth swing and therefore a larger data retention loss and a wider Vth distribution width. The erased state is considered to have no data retention loss.

FIG. 8G depicts an alternative to the example Vth distributions of FIG. 8E, where the erase state is more deeply erased. The Vth distributions from FIG. 8E are repeated for the A, B, C, D, E, F and G states. However, the Vth distribution of the erased state is lower in FIG. 8G than in FIG. 8E. The Vth distributions 820b and 820c represent the erased state cells without and with program disturb, respectively. By providing a deeper erase (e.g., a lower Vth distribution) for the erased state cells, a larger margin is created between the upper tail of the Vth distribution of the erased state cells and the lower tail of the Vth distribution of the lowest programmed data state, e.g., the A state. This reduces program disturb.

Figure 8H:
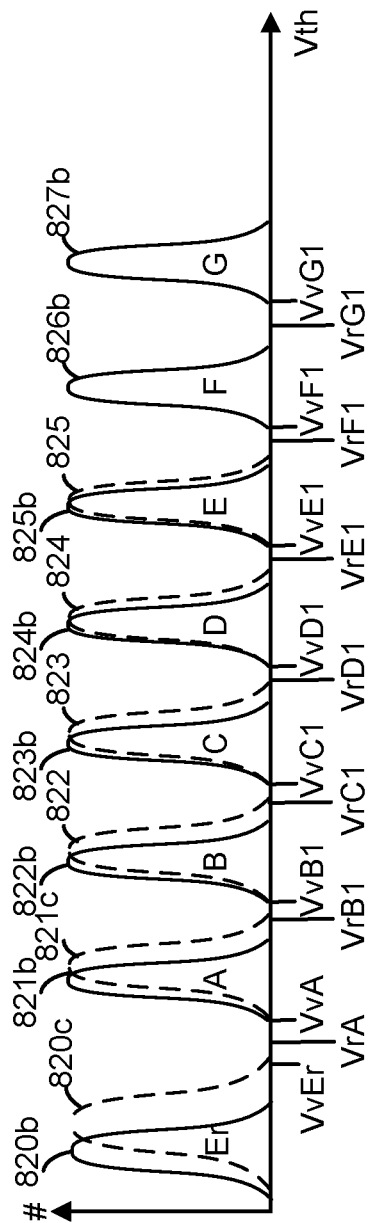
FIG. 8H depicts an alternative to the example Vth distributions of FIG. 8G, where the programmed data states are shifted lower.

FIG. 8H depicts an alternative to the example Vth distributions of FIG. 8G, where some of the programmed data states are shifted lower. The verify voltages for the B, C, D, E, F and G states are lowered from VvB, VvC, VvD, VvE, VvF and VvG to VvB1, VvC1, VvD1, VvE1, VvF1 and VvG1, respectively. These are lowered verify levels. The Vth distributions for the A, B, C, D, E, F and G states without program disturb are 821b, 822b, 823b, 824b, 825b, 826b and 827b, respectively. The Vth distributions for the A, B, C, D and E states with program disturb are 821c, 822c, 823c, 824c and 825c, respectively. The read levels may be lowered accordingly from VrB, VrC, VrD, VrE, VrF and VrG to VrB1, VrC1, VrD1, VrE1, VrF1 and VrG1, respectively.

The A state verify level may be kept the same as in FIG. 8G to maintain the margin between the Vth distribution of the erased state cells and the A state cells. The amount of the reduction in the verify level can be relatively higher when the data state is relatively higher. With this approach, data retention loss is improved because the increase in Vth for the programmed data states is reduced. To provide a sufficient margin between the Vth distributions of the programmed data states, the Vth distributions can be made narrower compared to FIG. 8G. This can be achieved by a slower programming of the cells. For example, a reduced Vpgm step size may be used. Another approach involves raising the bit line voltages to slow programming when the Vth of a cell passes an offset verify level which is below the final verify level at which programming is completed for a cell. See also FIGS. 13H and 13I.

Figure 8I:
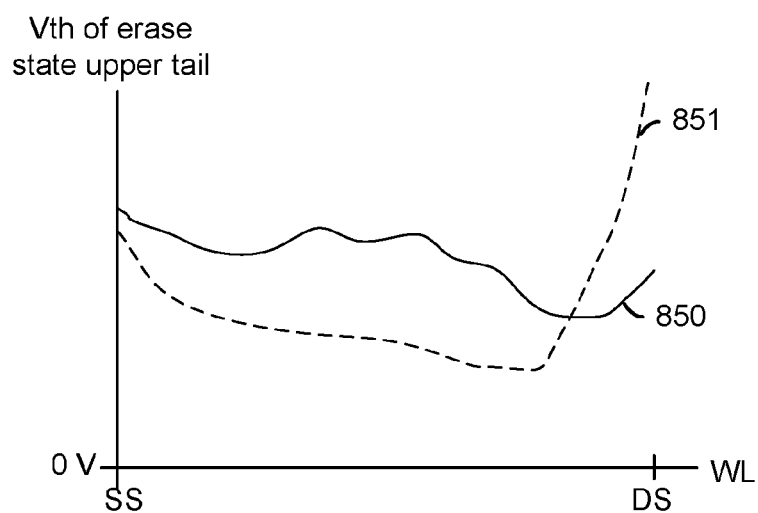
FIG. 8I depicts a plot of a Vth of the upper tail of the erased state distribution versus word line position, for room temperature (plot 850) and for a hot temperature (plot 851).

FIG. 8I depicts a plot of a Vth of the upper tail of the erased state distribution versus word line position, for room temperature (plot 850) and for a hot temperature (plot 851). The word lines extend between a source side (SS) and a drain side (DS) of a block. The associated memory cells extend between a source side (SS) and a drain side (DS) of a string. As shown in FIG. 8E, for example, the upper tail of the Vth distribution increase due to program disturb. This increase is a function of memory cell position in the string (e.g., word line position in a block) and temperature. At room temperature, e.g., 25 C, the Vth is fairly constant for the different word line positions. However, at a hot temperature such as 85 C, there is a sharp increase in Vth for a group of one or more drain-side cells. There may also be an increase in Vth for a group of one or more source-side cells which is less sharp than the increase for the drain-side. A sharp increase in Vth should be avoided to avoid an excessive number of read errors. The Vth is for the worst case scenario of the erased state cells.

Figure 8J:
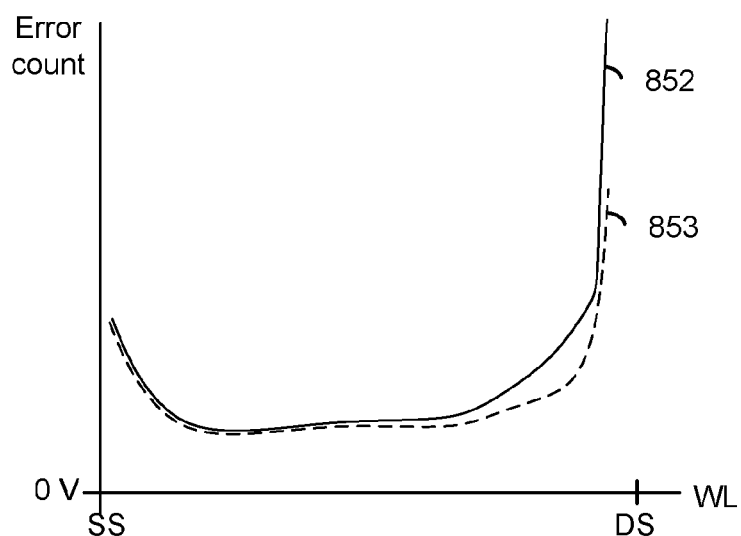
FIG. 8J depicts a plot of an error count in a read operation versus word line position, for the normal erase depth (plot 852) of FIG. 8E, and for the deeper erase depth (plot 853) of FIG. 8G.

FIG. 8J depicts a plot of an error count in a read operation versus word line position, for the normal erase depth (plot 852) of FIG. 8E, and for the deeper erase depth (plot 853) of FIG. 8G. The number of errors is relatively high for the drain-side word lines due to the reduced channel boosting, as mentioned. The plot 833 shows that the number of errors decreases for the drain-side cells when a deeper erase depth is used. This provides a wider margin between the erased state and the A state, where most read errors occur, mainly from erased states cells having a Vth>VrA.

Generally, error correcting or error detecting code bits can be calculated when data is being programmed into cells into the memory cells. Subsequently, when reading the cells, an error count can be determined based on errors detected by the error correcting or detecting code. Error correcting codes (ECCs), such as Hamming codes, can detect and correct some errors, while error detecting codes, such as those using parity bits or checksums, can only detect errors without correcting them. In particular, the read data is run through the error correcting or detecting code to see if the output is consistent with the error correcting or detecting bits. If the output is not consistent, there is an error in the data. Accordingly, an error metric such as an error count can be generated based on a number of errors which are detected for a unit of cells which are being read. The count may include all detected errors, including those which can be corrected, or only errors which cannot be corrected, for instance. The count can be expressed as a raw count, a percentage, or other error metric. For example, consider a memory device in which ECC bits are used to correct read errors, each set of ECC bits handles 512 bytes of user data and the ECC can correct a maximum of eight errors.

The unit of data which is read may be a sector. A memory array can be divided into a large number of blocks of storage elements, where the block is erased as a unit. Further, each block can be divided into a number of pages, e.g., 8, 32, 64 or more pages, where the page is programmed as a unit. A page can store one or more sectors, where a sector includes user data and overhead data, such as error correcting or error detecting code bits that have been calculated from the user data of the sector. A sector of user data is typically 512 bytes, while overhead data is typically an additional 16-20 bytes.

A count of read errors can be obtained from one or more units of data in a block. For example, this can include cells in one or more word lines. In one approach, the count of read errors is made during each read operation and stored for subsequent use in determining whether a deep erase is indicated, or the depth of such a deep erase.

In one approach, the string of memory cells is in a block of memory cells; before the erase of the string of memory cells, the control circuit is configured to program memory cells in the block of memory cells to provide programmed memory cells, read the programmed memory cells and determine a number of read errors based on the read of the programmed memory cells; and the control circuit is configured to provide the erase depth of the one or more drain-side memory cells to be deeper when the number of read errors exceeds an error threshold than when the number of read errors does not exceed the error threshold, when the temperature exceeds the threshold. The control circuit may be configured to provide the erase depth of the one or more drain-side memory cells to be proportional to the number of read errors.

Figure 8K:
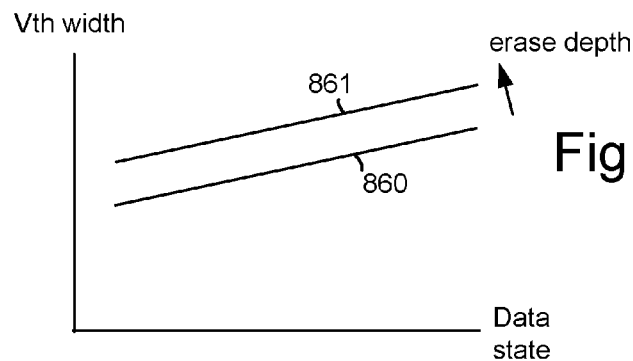
FIG. 8K depicts a plot of a width of a Vth distribution with versus data state, for the normal erase depth (plot 860) of FIG. 8E, and for the deeper erase depth (plot 861) of FIG. 8G.

FIG. 8K depicts a plot of a width of a Vth distribution with versus data state, for the normal erase depth (plot 860) of FIG. 8E, and for the deeper erase depth (plot 861) of FIG. 8G. These are Vth distributions after programming, following the erase. This indicates that the Vth distribution becomes wider for higher data states due to data retention loss. Moreover, the problem is made worse when a deep erase is used due to the correlation between the increase in Vth during programming and the amount of data retention loss. This example represents the case of room temperature.

Figure 8L:
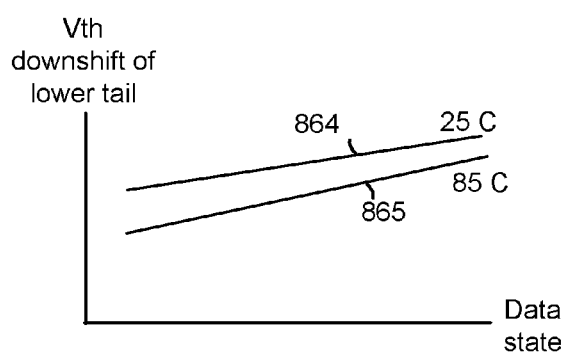
FIG. 8L depicts a plot of the Vth downshift of the lower tail versus data state, for room temperature (plot 864) and for a hot temperature (plot 865).

FIG. 8L depicts a plot of the Vth downshift of the lower tail versus data state, for room temperature (plot 864), e.g., 25 C, and for a hot temperature (plot 865), e.g., 85 C. These are Vth distributions after programming, following the erase. This indicates that the downshift of the lower tail of the Vth distribution is worse for relatively higher data states. However, the downshift of the lower tail is reduced at higher temperatures. As a result, data retention loss is not problematic at higher temperatures. The reduction in data retention loss due to a higher temperature can offset an increase in data retention loss due to a deeper erase. At the same time, program disturb will be reduced by the deep erase.

FIG. 9 depicts a waveform of an example programming operation. The horizontal axis depicts a program loop (PL) number and the vertical axis depicts control gate or word line voltage. Generally, a programming operation can involve applying a pulse train to a selected word line, where the pulse train includes multiple program loops or program-verify iterations. The program portion of the program-verify iteration comprises a program voltage, and the verify portion of the program-verify iteration comprises one or more verify voltages such as discussed in connection with FIG. 8A-8D.

Each program voltage includes two steps, in one approach. Further, Incremental Step Pulse Programing (ISPP) is used in this example, in which the program voltage steps up in each successive program loop using a fixed or varying step size. This example uses ISPP in a single programming pass in which the programming is completed. ISPP can also be used in each programming pass of a multi-pass operation. As noted, a smaller step size can be used to slow down programming and achieve narrower and closer Vth distributions such as discussed in connection with FIG. 8H.

The waveform 900 includes a series of program voltages 901, 902, 903, 904, 905, . . . 906 that are applied to a word line selected for programming and to an associated set of non-volatile memory cells. One or more verify voltages can be provided after each program voltage as an example, based on the target data states which are being verified. 0 V may be applied to the selected word line between the program and verify voltages. For example, A- and B-state verify voltages of VvA and VvB, respectively, (waveform 910) may be applied after each of the program voltages 901 and 902. A-, B- and C-state verify voltages of VvA, VvB and VvC (waveform 911) may be applied after each of the program voltages 903 and 904. After several additional program loops, not shown, E-, F- and G-state verify voltages of VvE, VvF and VvG (waveform 912) may be applied after the final program voltage 906.

Figure 10A:
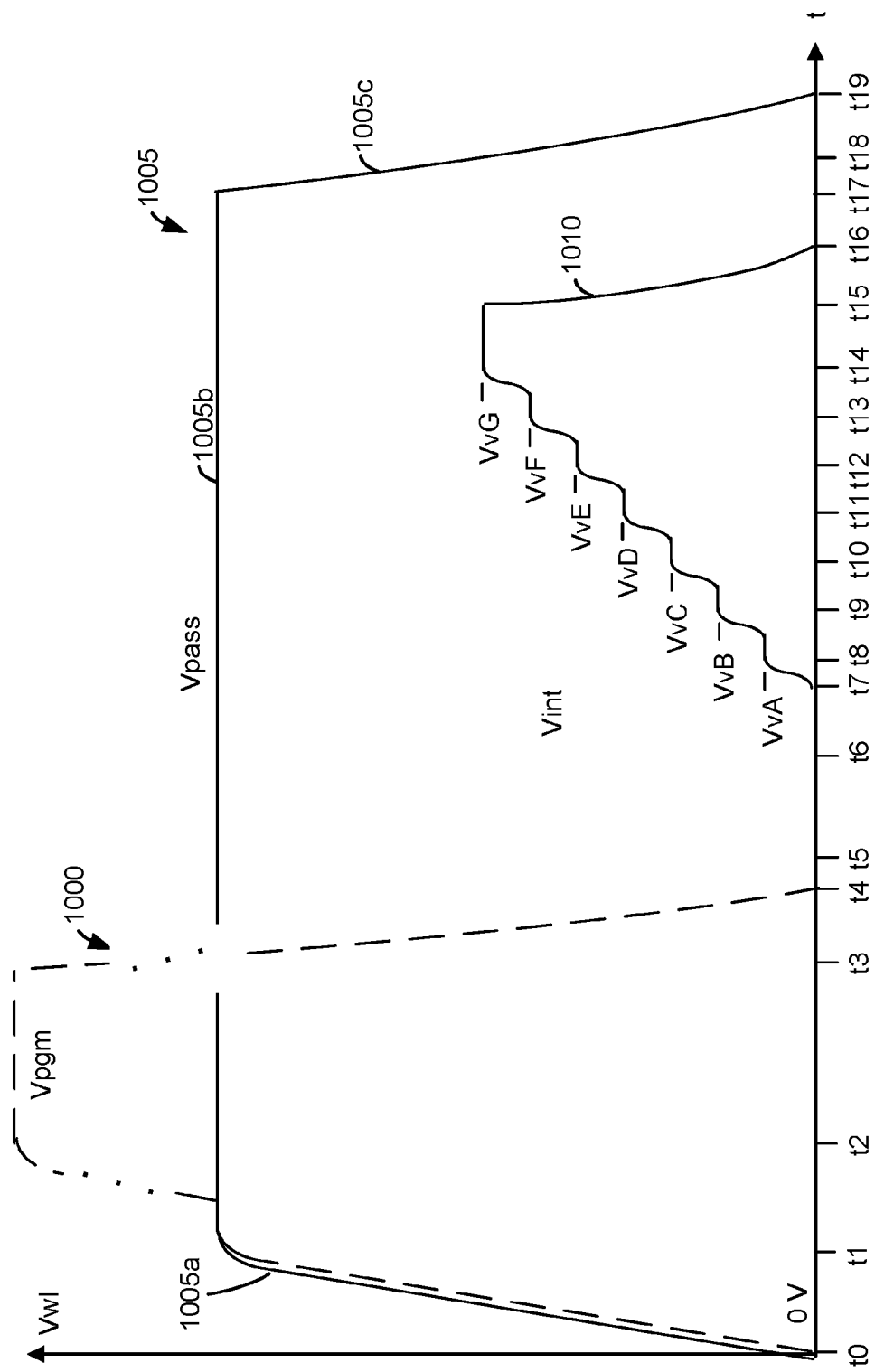
FIG. 10A depicts a plot of example waveforms in a programming operation.

FIG. 10A depicts a plot of example waveforms in a programming operation. The time period shown represents one program-verify iteration. The horizontal axis depicts time and the vertical axis depicts word line voltage, Vwl. A program voltage 1000 is applied to a selected word line from t0-t4 and reaches a magnitude of Vpgm. A pass voltage 1005 is applied to the unselected word lines from t5-t19 and reaches a magnitude of Vpass, which is sufficiently high to provide the cells in a conductive state so that the sensing (e.g., verify) operations can occur for the cells of the selected word line. The pass voltage includes an increasing portion 1005a, a fixed amplitude portion 1005b, for instance, at Vpass and a decreasing portion 1005c. The program voltage can temporarily pause at an intermediate level such as Vpass to avoid a single large transition which can have undesired coupling effects. Optionally, the pass voltage may be increased sooner so that Vpass is reached by t0.

A verify voltage 1010 is applied to the selected word line. In this example, all seven verify voltages are applied, one after another. An eight-level memory device is used in this example. Verify voltages of VvA, VvB, VvC, VvD, VvE, VvF and VvG are applied at t8, t9, t10, t11, t12, t13 and t14, respectively. The waveform decreases from VvG to 0 V or other steady state level from t15-t16.

Figure 10B:
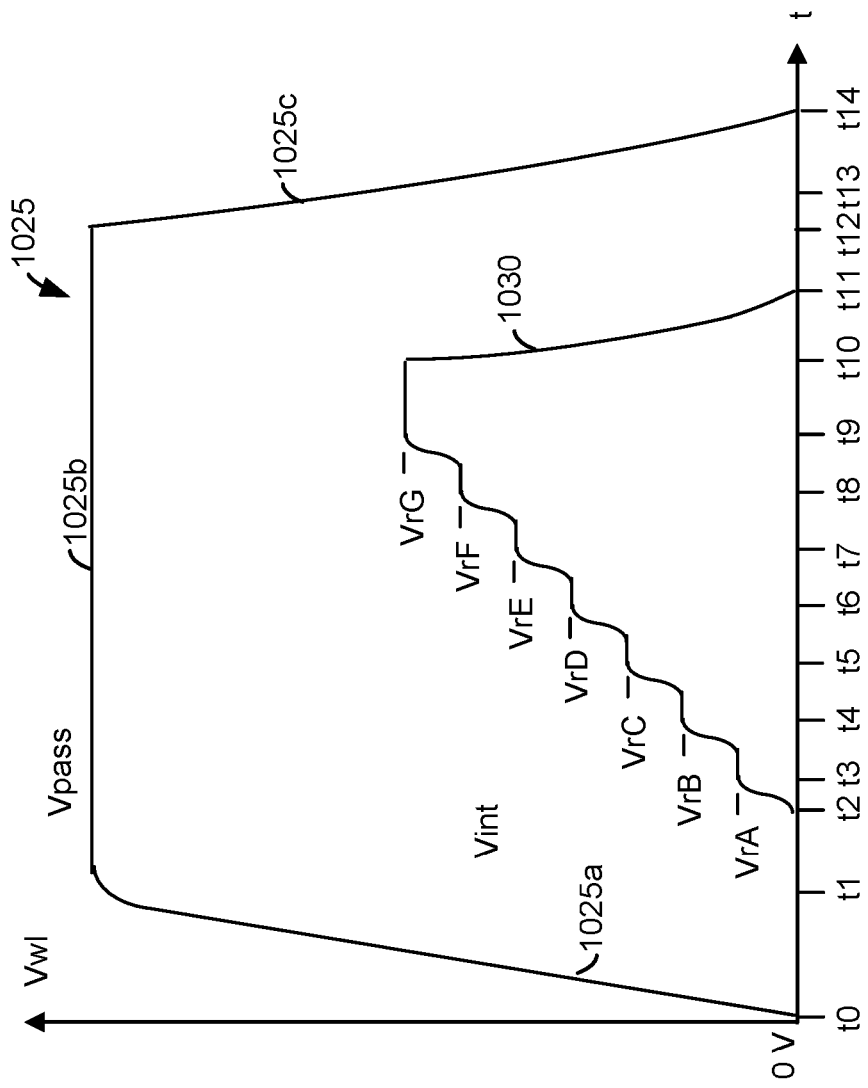
FIG. 10B depicts a plot of example waveforms in a read operation.

FIG. 10B depicts a plot of example waveforms in a read operation. The horizontal axis depicts time and the vertical axis depicts word line voltage, Vwl. A pass voltage 1025 is applied to the unselected word lines from t0-t14 and reaches a magnitude of Vpass. The pass voltage includes an increasing portion 1025a, a portion 1025b at Vpass and a decreasing portion 1025c. A read voltage 1030 is applied to the selected word line. In this example, all seven read voltages are applied, one after another. An eight-level memory device is used in this example. Read voltages of VrA, VrB, VrC, VrD, VrE, VrF and VrG are applied at t3, t4, t5, t6, t7, t8 and t9, respectively. The waveform decreases from VrG to 0 V from t10-t11.

FIG. 11A depicts example voltages in an erase operation which uses gate-induced drain leakage (GIDL) to charge up the channel of a NAND string. An erase operation generally involves charging a channel of a string of memory cells while applying a control gate voltage to the memory cells which results in a positive channel-to-gate voltage. This drives electrons out of the charge-trapping layer, lowering the Vth of the cells. The cells transition from the programmed data states to the erased state.

FIG. 11A depicts example voltages in an erase operation which uses gate-induced drain leakage (GIDL) to charge up the channel of a NAND string. This approach can be used, e.g., in erasing cells in the three-dimensional device of FIG. 4. The vertical axis depicts voltage and the horizontal axis depicts time. The waveform 1100 depicts a series of bit line and/or source line voltages 1101, 1103 and 1105 with magnitudes of Verase1a, Verase2a and Verase3a, respectively, which step up in each erase-verify iteration. The waveform also depicts select gate voltages 1102, 1104 and 1106 with a common magnitude of Vsg_er, in one approach. In another approach, the select gate voltage also steps up with the bit line and/or source line voltage. The waveform provides a number of erase-verify loops EV1a, EV2a and EV3a, each of which includes an erase portion and a verify portion (verify test). The channel of a NAND string can be charged up in an erase operation based on GIDL, which is generated in proportion to the drain-to-gate voltage of the select gate transistors at the drain-end and/or source-end of the NAND sting. In another option, the erase voltage steps up to its peak in two steps instead of one to allow time for the charge up of the channel to occur. In another option, the erase voltage and the select gate voltage both step up to their peaks in two steps.

FIG. 11B depicts an example channel voltage consistent with FIG. 11A. The channel voltage (Vch) in represented by a waveform 1110 which has elevated portions 1111, 1112 and 1113 coincident with the elevated voltages of FIG. 11A. In the approach of FIGS. 11A and 11B, the word line (control gate) voltage is at a level, e.g., 0-1 V, which provides a positive channel-to-gate voltage. The channel voltage is significantly higher than the word line voltage. A deeper or stronger erase can be provided by lowering the control gate voltage and thereby increasing the channel-to-gate voltage. Various techniques described herein set the control gate voltage lower for drain-side memory cells during erase based, e.g., on temperature and/or error count.

FIG. 11C depicts example erase voltages in an erase operation which applies a positive voltage to a p-well of a substrate. This approach is particularly suitable for a 2D memory device. The waveform 1120 comprises voltage pulses 1121, 1122 and 1123 with amplitudes of Verase1b, Verase2b and Verase3b, respectively, which can step up in each loop. The voltage pulses are in erase-verify loops EV1b, EV2b and EV3b. The word line voltage may be at a level, e.g., 0 V or close to 0 V, which provides a positive channel-to-gate voltage.

FIG. 11D depicts example erase voltages in an erase operation which applies a negative voltage to the word lines in a block. In this approach, the memory device has the capability to apply a negative voltage on the word lines, such as by using a negative charge pump. In one approach, the drain (bit line) and source can be set at 0 V, and there is a positive source-to-control gate voltage of the memory cells. The waveform 1130 depicts a series of negative control gate voltages 1131, 1132 and 1133 with magnitudes of Verase1c, Verase2c and Verase3c, respectively, in erase-verify loops EV1c, EV2c and EV3c, respectively.

FIG. 11E depicts example verify voltages in an erase operation. FIG. 11E is time aligned with FIG. 11A to 11D and can be used with any of these waveforms to provide the verify test of an erase-verify loop. The waveform 1140 includes voltage pulses 1141, 1142 and 1143 at VvEr which are applied to the word lines during a verify test of an erase operation. The erase-verify voltages can be small positive values, 0 V, or negative values.

Figure 12A:
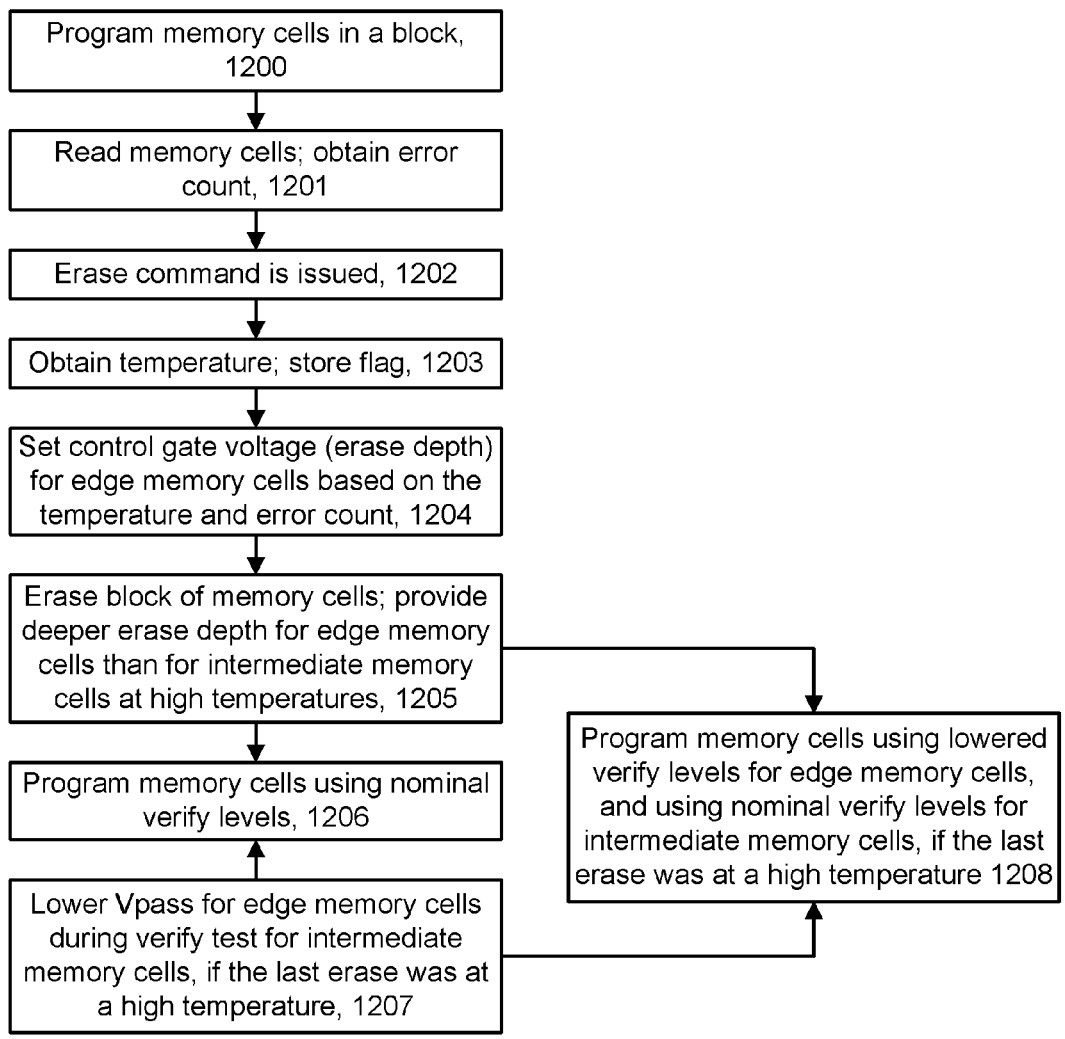
FIG. 12A depicts an example process for programming and erasing memory cells in a block.

FIG. 12A depicts an example process for programming and erasing memory cells in a block. Step 1200 includes programming memory cells in a block. This can include memory cells of one or more word lines, for example. Step 1201 includes reading the memory cells and obtaining an error count. At step 1202, an erase command is issued. At step 1203 an ambient temperature is obtained, such as discussed in connection with FIG. 1B. A flag or other indication of whether the temperature is relatively high (e.g., T>Tth) may also be stored. This flag indicates whether a deep erase mode will be used in the next erase operation. Step 1204 includes setting a control gate voltage (e.g., erase depth) for edge memory cells based on the temperature and/or the error count. The number of drain-side data memory cells in a string or block which are considered for a deeper erase can be, e.g., no more than 10-25% of the data memory cells in the string or block. Similarly, the number of source-side data memory cells in a string or block which are considered for a deeper erase can be, e.g., no more than 10-25% of the data memory cells in the string or block. In one implementation, the number of source-side data memory cells in a string or block which are considered for a deeper erase is less than the number of drain-side data memory cells in a string or block which are considered for a deeper erase.

Step 1205 includes erasing the block of memory cells, providing a deeper erase depth for the edge memory cells than for intermediate memory cells at high temperatures. The erase depth (e.g., control gate voltage) may be equal for the edge memory cells and the intermediate memory cells at lower temperatures such as room temperature, in one approach.

Subsequently, step 1206 or 1208 may be followed. Step 1206 includes programming the memory cells using nominal verify levels such as discussed in connection with FIG. 8A-8D. Step 1208 includes programming the memory cells using lowered verify levels for the edge memory cells, such as discussed in connection with FIG. 8H, and using nominal verify levels for the intermediate memory cells, if the last erase was at a high temperature (e.g., as indicated by the flag set at step 1203). During the programming of step 1206 or 1208, step 1207 may set a lower Vpass for edge memory cells during the verify test for intermediate memory cells, if the last erase was at a high temperature. Otherwise, a nominal Vpass may be set. See also FIG. 14A to 14F.

Not all steps are required in the example processes provided herein. For example, error count may be used with or without temperature to set erase depth, and temperature may be used with or without error count to set erase depth. The lower Vpass may be used regardless of the criteria used to set a deeper erase depth.

The method thus includes obtaining data indicative of a temperature; and erasing a block of memory cells, wherein the memory cells comprise memory cells at a drain-side of the block, memory cells at a source-side of the block and intermediate memory cells between the memory cells at the drain-side of the block and the memory cells at the source-side of the block, wherein the erasing comprises charging channel regions of the block while applying voltages to control gates of the memory cells at the source-side of the block, voltages to control gates of the intermediate memory cells and voltages to control gates of the memory cells at the drain-side of the block, the voltages applied to the control gates of the memory cells at the drain-side of the block are lower than the voltages applied to the control gates of the intermediate memory cells and the voltages applied to the control gates of the memory cells at the source-side of the block, when the temperature exceeds a threshold.

FIG. 12B depicts an example process for programming memory cells, as an example of step 1200, 1206 or 1208 of FIG. 12A. The programming can occur according to a word line programming order in which the lowest word line, e.g., WL0, is programmed first. Optionally, other word lines, e.g., WL1, WL2 and so forth are programmed successively after WL0. The programming can occur in response to a programming command involving a set of memory cells arranged in a plurality of strings and connected to a plurality of word lines. For example the command can be issued by the state machine or other control circuit. Moreover, the programming can occur one sub-block at a time.

Step 1210 selects a word line WLn (a selected word line) for programming, initializes Vpgm and sets Vpass. There is an option to set a lowered Vpass such as discussed in connection with step 1207 of FIGS. 12A and 14A to 14F. Step 1211 begins a program loop or program-verify iteration. Step 1212 includes applying Vpgm to the selected word line and Vpass to the unselected word lines, e.g., as in FIG. 10A. These voltages are applied concurrently, at least in part. Step 1213 involves performing verify tests, e.g., as in FIGS. 9 and 10B. In one approach, as described in FIG. 9, verify tests are performed for a subset of all target data states, for the memory cells which have not yet completed programming.

Decision step 1215 determines if programming is completed for the selected word line. Decision step 1215 is true if all, or nearly all of the memory cells which are to be programmed have passed their respective verify test. A memory cell passes a verify test when a verify voltage is applied to its control gate via a word line and the memory cell is determined by sensing circuitry to be in a non-conductive state. In this case, the Vth of the memory cell exceeds the verify voltage. If decision step 1215 is false, Vpgm is incremented at step 1214, and a next program loop is performed at step 1211. If decision step 1215 is true, decision step 1216 determines whether there is another word line to program, e.g., in the currently selected sub-block. If decision step 1216 is false, decision step 1217 determines whether there is another sub-block to program, e.g., in the currently selected block. If decision step 1216 is true, a next word line in the current sub-block is selected to be programmed at step 1210. If decision step 1217 is true, a first word line in the next sub-block is selected to be programmed at step 1210. If decision step 1217 is false, the programming operation ends at step 1218.

Figure 12C:
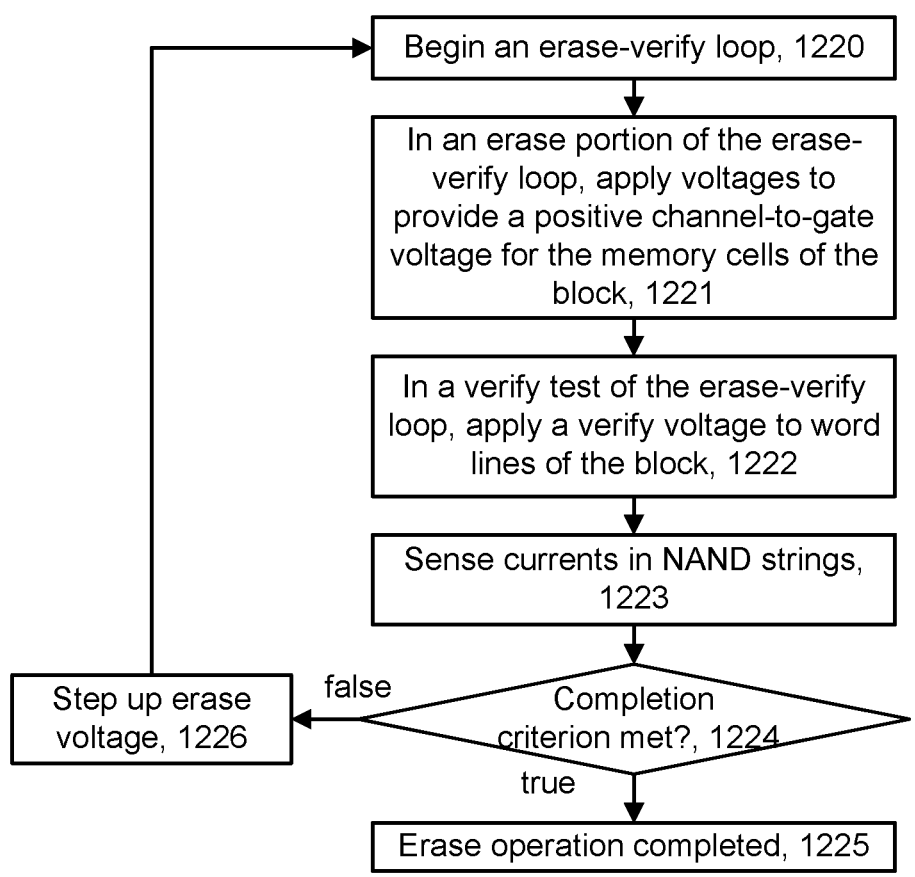
FIG. 12C depicts an example process for erasing memory cells, as an example of step 1205 of FIG. 12A.

FIG. 12C depicts an example process for erasing memory cells, as an example of step 1205 of FIG. 12A. Typically, an entire block of cells is erased concurrently. An erase operation comprises erase-verify loops for the block. The erase operation can occur in response to an erase command involving a set of memory cells arranged in a plurality of strings and connected to a plurality of word lines. For example the command can be issued by the state machine or other control circuit. Step 1220 begins an erase-verify loop. Step 1221 includes, in an erase portion of the erase-verify loop, applying voltages to provide a positive channel-to-gate voltage for each memory cell of the block. Various biasing schemes were discussed, e.g., in connection with FIG. 11A to 11D. Typically, the bit line, source line and/or control gate voltages can be set in a 3D memory device while a substrate/p-well voltage can also be set in a 2D memory device. In one approach, one or more drain-side memory cells in a string are provided with a higher channel-to-gate voltage than other memory cells in the string.

At step 1222, in a verify test of the erase-verify loop, a verify voltage is applied to the word lines of the block. Step 1223 includes sensing currents in the strings. For example, each NAND string may be connected to a respective sense circuit via a respective bit line. See, e.g., FIGS. 7B and 16A to 16C. A decision step 1224 determines if a completion criterion is met based on step 1222. For example, the completion criterion may be met if all, or at least a specified portion of the NAND strings in a block, e.g., 90%, have a current above a reference level and are thus in a conductive state. The current in each string can be compared to a reference current in a verify test that occurs for each string of a set of strings. If decision step 1224 is true, the erase operation is completed at step 1225. If decision step 1224 is false, step 1226 steps up the erase voltage and a next erase-verify loop begins at step 1220.

In one approach, the erase-verify test is performed for a set of strings which are connected to a common SGD line. The erase-verify test can be performed for one set of strings in a sub-block, then another set of strings in another sub-block, and so forth. The erase voltages may be applied to the different sets of strings in different sub-blocks concurrently. An erase operation can involve one or more sets of strings in a block.

FIG. 13A depicts an example plot showing control gate voltages versus word line position in an erase operation, where two control gate voltages are available for drain-side word lines based on temperature. In FIG. 13A to 13C, there are eleven data word lines, WL0-WL11, consistent with some previous examples. This is a simplified example. In practice, there may be a different number of word lines. Some 3D memory devices have up to 32-64 or more word lines, for example.

When temperature T is less than or equal to a nominal temperature such as room temperature (a threshold temperature Tth), the control gate voltage is a nominal level, Vcg_nom for all word lines, in one approach. As a result, the channel-to-control gate voltage is at a nominal level and the erase depth is a nominal erase depth.

For the one or more drain-side word lines, e.g., WL8-WL10, when T>Tth, the control gate voltage is a reduced level, Vcg_deep1. As a result, the channel-to-control gate voltage is at a higher level than the nominal level and the erase depth is deeper than the nominal erase depth. For the remaining word lines, the control gate voltage is at the nominal level, Vcg_nom.

FIG. 13B depicts an example plot showing control gate voltages versus word line position in an erase operation, where two control gate voltages are available for drain-side word lines and source-side word lines based on temperature. In this example, one or more drain-side word lines, e.g., WL8-WL10, and one or more source-side word lines, e.g., WL0 and WL1 are subject to a deep erase when T>Tth. Further, the erase of the one or more source-side word lines is less deep than the erase of the one or more drain-side word lines. When T>Th, the one or more drain-side word lines have a control gate voltage of Vcg_deep1 and the one or more source-side word lines have a control gate voltage of Vcg_deep1s>Vcg_deep1. As a result, the one or more drain-side word lines are erased more deeply than the one or more source-side word lines. When T<=Tth, the control gate voltage for all word lines is at the nominal level, Vcg_nom, for example.

FIG. 13C depicts an example plot showing control gate voltages versus word line position in an erase operation, where gate voltages decrease progressively with decreasing distance to the drain-end of the string based on temperature. In this example, when T>Tth, WL8, WL9 and WL10 receive control gate voltages of Vcg_deep3, Vcg_deep2 and Vcg_deep1, respectively, where Vcg_deep3>Vcg_deep2>Vcg_deep1. Thus, the erase is deepest on the cells of WL10, the erase is second deepest on the cells of WL9 and the erase is third deepest on the cells of WL8. The remaining word lines receive Vcg_nom. When T<=Tth, the control gate voltage for all word lines is at the nominal level, Vcg_nom, for example.

FIG. 13D depicts an example plot of control gate voltages versus temperature in an erase operation, where the control gate voltage is stepped down from Vcg_nom to Vcg_deep1 when T>Tth. This example is consistent with FIG. 13A. The cells of the one or more drain-side word lines receive Vcg_nom if T<=Th and Vcg_deep1<Vcg_nom if T>Th. This approach provides a simplified implementation.

FIG. 13E1 depicts an example plot of control gate voltage versus temperature in an erase operation, where the control gate voltage is set based on a ramp from Vcg_nom to Vcg_deep1 as a function of T when T>Tth. The cells of the one or more drain-side word lines receive Vcg_nom if T<=Th and a voltage which is inversely proportional to temperature when T>Th. That is, the control gate voltage decreases as T increases. This approach allows the erase depth to vary over a range of temperatures.

FIG. 13E2 depicts an example plot of control gate voltage versus temperature in an erase operation, where the control gate voltage is set based on different ramps for different word lines as a function of T when T>Tth. The voltages Vcg_deep1, Vcg_deep2 and Vcg_deep3 of FIG. 13C, represented by plots 1310, 1311 and 1312, respectively, may be reached when T reaches a value Tx>Tth. This approach applies temperature compensation on the control gate voltage of the one or more drain-side memory cells using a temperature coefficient. A negative temperature coefficient can be defined such that a higher temperature results in a lower control gate voltage during an erase operation, and therefore a deeper erase. Moreover, we can assign different temperature coefficients for different word lines. For example, the first drain-side word line (e.g., WL10 in FIG. 7A) has the worst program disturb, so we want to erase the cells of the word line the deepest. To achieve this, the largest temperature coefficient should be used so that Vcg decreases the fastest as T increases. Progressively smaller temperature coefficients can be used as the distance of the word line from the drain-side of the block increases. For example, the plots 1310, 1311 and 1312 can be used for WL10, WL9 and WL8, respectively.

FIG. 13F depicts an example plot of control gate voltages versus temperature in an erase operation, where the control gate voltage is stepped down from Vcg_nom to a value between Vcg_deep1 and Vdeep1a as a function of a number of errors, when T>Tth. The cells of the one or more drain-side word lines receive Vcg_nom if T<=Th and a voltage which is inversely proportional to temperature and to a number of read errors when T>Th. That is, the control gate voltage decreases as T increases and the number of read errors increases. For example, if the number of read errors exceeds a threshold, and T>Tth, Vcg_deep1a may be used. If the number of read errors does not exceed a threshold, and T>Tth, Vcg_deep1>Vcg_deep1a may be used. Optionally, a control gate voltage may be obtained by interpolating between the solid line and the dashed line based on the number of read errors. This approach allows the erase depth to vary based on both temperature and read errors. In another approach, the erase depth varies based on both the number of read errors but not based on temperature. The number of read errors is a measure of the amount of program disturb and therefore the need for a deep erase, and the depth the erase. In one approach, the number of read errors is obtained from the same word lines which are subject to the deep erase, e.g., the one or more drain side word lines.

FIG. 13G depicts an example plot of control gate voltages versus temperature in an erase operation, where the control gate voltage is set based on a ramp from Vcg_nom to a value between Vcg_deep1 and Vdeep1a as a function of a number of errors and as a function of T, when T>Tth. The cells of the one or more drain-side word lines receive Vcg_nom if T<=Th and a voltage which is inversely proportional to temperature and number of read errors when T>Th. That is, the control gate voltage decreases as T increases and as the number of read errors increases. For example, if the number of read errors exceeds a threshold, and T>Tth, the plot represented by a dashed line may be used to set the control gate voltage of the one or more drain-side word lines. If the number of read errors does not exceed a threshold, and T>Tth, the plot represented by a solid line may be used to set the control gate voltage of the one or more drain-side word lines. This approach allows the erase depth to vary based on both temperature and read errors. Optionally, a control gate voltage may be obtained by interpolating between the solid line and the dashed line based on the number of read errors.

Figure 13H:
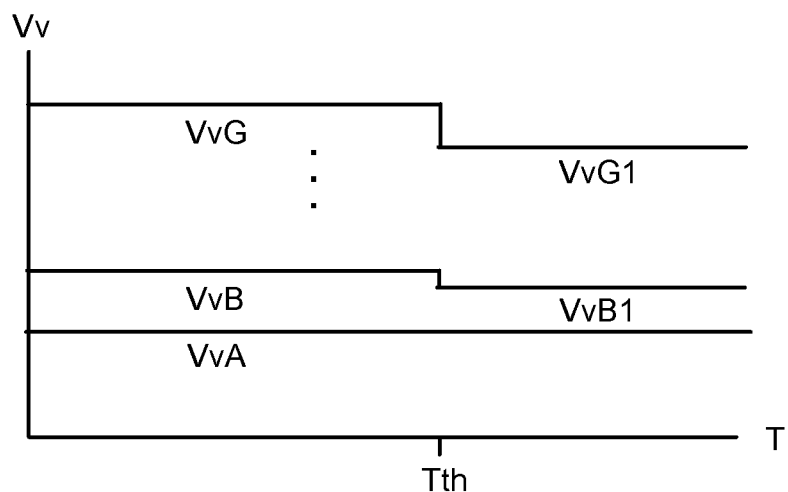
FIG. 13H depicts an example plot of a verify voltage versus temperature in an erase operation, where the verify voltage is stepped down as a function of data state, when T>Tth.

FIG. 13H depicts an example plot of a verify voltage versus temperature in an erase operation, where the verify voltage is stepped down as a function of data state, when T>Tth. As mentioned (see FIG. 8H), the verify voltages of the one or more drain-side word lines may be reduced so that the increase in Vth from the erased state to the highest programmed data state is reduced. This reduces program disturb because programming can be completed using a fewer program pulses. Also, the magnitude of the final program pulse is reduced. Data retention loss is also improved. The plot denotes example verify voltages for the B state and the G state, in an eight-state memory. In one approach, the verify voltage for the lowest programmed data state, e.g., the A state, is not changed when temperature increases. This is to maintain a margin between the A state and the erased state. Instead, the verify voltage is reduced for the remaining programmed data states, e.g., the second lowest programmed data state (B state) through the highest programmed data state (G state) in this example. Further, the reduction can be proportional to the data state such that a larger reduction is provided for the highest programmed data state and the smallest reduction is provided for the second lowest programmed data state. The nominal verify voltage VvA is used regardless of T, in this example. The nominal verify voltages of VvB through VvG are used if T<=Tth. Reduced verify voltages of VvB1 through VvG1 are used if T>Tth.

Figure 13I:
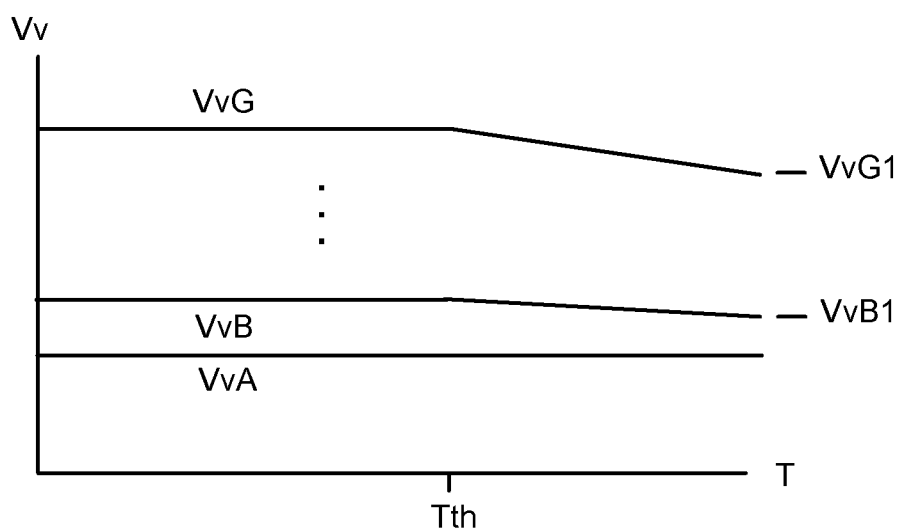
FIG. 13I depicts an example plot of a verify voltage versus temperature in an erase operation, where the verify voltage is set based on a ramp as a function of T, when T>Tth.

FIG. 13I depicts an example plot of a verify voltage versus temperature in an erase operation, where the verify voltage is set based on a ramp as a function of T, when T>Tth. In this example, VvB through VvC are inversely proportional to temperature when T>Tth. Further, a rate of decrease of VvG (the verify voltage of a relatively higher programmed data state) with T is greater than a rate of decrease of VvB (the verify voltage of a relatively low programmed data state) with T, in one approach.

FIG. 14A depicts resistance in a NAND string during sensing of a verify test in a program operation, where T>Tth in the last erase operation, and Vpass_nom or Vpass_low is applied to one or more drain side word lines. The capacitance is relatively low for the channel area of a string which is adjacent to cells which are more deeply erased, compared to cells which have a nominal erase depth. As a result, during sensing of a current in the string, there will be relatively low resistance to the flow of electrons in this channel area. This can lead to a programming operation being completed too soon for other cells in the string. To avoid this, the pass voltage can be lowered for the deeply erased cells when sensing other cells in the string which are not deeply erased. The pass voltage is a voltage which is applied to the control gates of memory cells which are not currently being sensed. These are memory cells connected to the unselected word lines. The pass voltage is sufficiently high to provide the associated memory cells in a conductive state. However, the degree of conductivity is higher when the pass voltage is higher. Similarly, the resistance is higher when the pass voltage is lower.

For example, a set of word lines 1400 includes one or more drain-side cells which have been deeply erased. A selected word line, WL4, is being programmed, and the remaining word lines include sets of word lines 1401 and 1402. When WL4 receives a verify voltage Vv, a nominal pass voltages Vpass_nom is applied to the sets of word lines 1401 and 1402. If T<=Tth during a last erase operation, prior to the current programming operation, Vpass_nom is applied to the sets of word lines 1400. If T>Tth during a last erase operation, Vpass_low<Vpass_nom is applied to the sets of word lines 1400.

The small arrow 1406 represents a relatively small channel resistance when Vpass_nom is applied to the set of word lines 1400 and when the associated memory cells are deeply erased. The medium arrow 1403 represents a nominal channel resistance when Vpass_nom is applied to the set of word lines 1401. The large arrow 1404 represents a relatively large channel resistance when Vpass_nom is applied to the set of word lines 1402. The channel resistance is relatively large because the memory cells of WLL0-WLL3 are in a programmed data state when WLL4 is being programmed, due to the word line programming order. The channel resistance of the memory cells of WLL5-WLL7 is lower than for WLL0-WLL3 because the memory cells of WLL5-WLL7 are in an erased state when WLL4 is being programmed. The memory cells of WLL8-WLL10 are also in an erased state when WLL4 is being programmed. The medium arrow 1405 represents a nominal channel resistance when Vpass_low is applied to the set of word lines 1400 and Vpass_nom is applied to the set of word lines 1401. Thus, by increasing the pass voltages for the deeply erased memory cells, a distortion is avoided in the sensing of the non-deeply erased memory cells, where this distortion could result in an early completion and incorrect programming of the non-deeply erased memory cells. In particular, the Vth distributions could be lower than usual so that an increased number of read errors occurs when the data is read back.

In an example implementation, a string 700n of memory cells extends from one or more drain-side memory cells (712-714) at a drain-side of the string to one or more source-side memory cells (704, 705) at a source-side of the string, wherein a plurality of intermediate memory cells (706-711) are between the one or more drain-side memory cells and the one or more source-side memory cells, the string of memory cells comprises a channel 700a and each memory cell of the string of memory cells comprises a control gate. A temperature-sensing circuit is configured to provide data indicative of a temperature. A control circuit to erase the string of memory cells, is configured to provide an erase depth for the one or more drain-side memory cells which is deeper when the temperature exceeds a threshold than when the temperature does not exceed the threshold.

The control circuit is further configured to, after the erase of the string of memory cells, program a selected memory cell 708 among a plurality of intermediate memory cells to a programmed data state while the one or more drain-side memory cells are in an erased state; and to determine that the selected memory cell has been programmed to the programmed data state, the control circuit is configured to concurrently: apply a verify voltage (Vv) to a control gate of the selected memory cell; sense a current in the string; and apply a pass voltage to the one or more drain-side memory cells, wherein the pass voltage is lower (Vpass_low) when the temperature exceeds the threshold during the erase of the string of memory cells than when the temperature does not exceed the threshold during the erase of the string of memory cells.

FIG. 14B depicts resistance in a NAND string during sensing of a verify test in a program operation, where T<=Tth in the last erase operation, and Vpass_nom is applied to one or more drain side word lines. In this case, the one or more drain side cells are not deeply erased, so an adjustment of their pass voltages is not indicated, in one approach. The medium arrow 1413 represents a nominal channel resistance when Vpass_nom is applied to the sets of word lines 1400 and 1401. As before, the large arrow 1404 represents a relatively large channel resistance when Vpass_nom is applied to the set of word lines 1402.

Figure 14C:
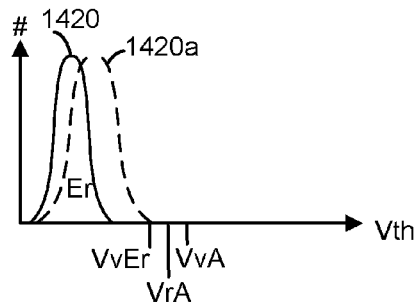
FIG. 14C depicts a Vth distribution for one or more drain-side memory cells subject to a deep erase, with and without program disturb.

FIG. 14C depicts a Vth distribution for one or more drain-side memory cells subject to a deep erase, with and without program disturb. The Vth distribution 1420 represents the case without program disturb. This is the case after erase and before programming. The Vth distribution 1420a represents the case with program disturb. Note that the Vth is relatively low compared to FIG. 14D. This represents the deep erase. For example, the upper tail of the Vth distribution 1420 may be below the erase verify voltages of VvEr.

Figure 14D:
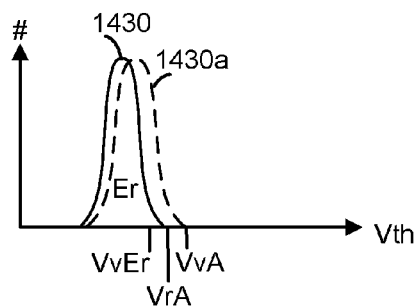
FIG. 14D depicts a Vth distribution for intermediate state memory cells not subject to a deep erase, with and without program disturb.

FIG. 14D depicts a Vth distribution for intermediate state memory cells not subject to a deep erase, with and without program disturb. The Vth distribution 1430 represents the case without program disturb. The Vth distribution 1430a represents the case with program disturb. The amount of program disturb is less than in FIG. 14C. Further, the erase is less deep than in FIG. 14C. For example, the upper tail of the Vth distribution 1430 may be slightly above VvEr. When the control gate voltages are different among the memory cells of a string, the erase depths will also be different. A lower control gate voltage results in a deeper erase depth.

Figure 14E:
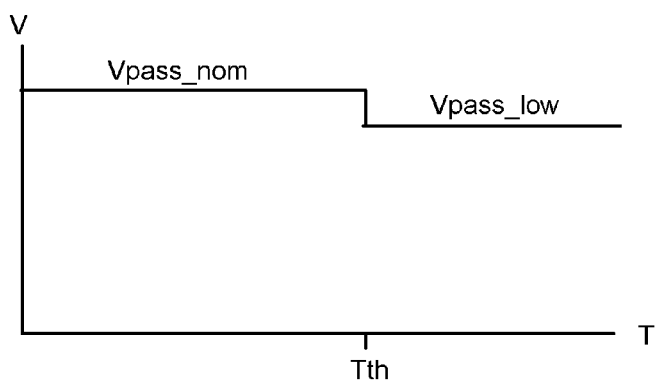
FIG. 14E depicts a plot showing a pass voltage applied to one or more drain-side memory cells during a verify test for an intermediate memory cell, where the pass voltage is stepped down to Vpass_low when T>Tth in the last erase operation, consistent with FIGS. 14A and 14B.

FIG. 14E depicts a plot showing a pass voltage applied to one or more drain-side memory cells during a verify test for an intermediate memory cell, where the pass voltage is stepped down to Vpass_low when T>Tth in the last erase operation, consistent with FIGS. 14A and 14B. The pass voltage is Vpass_nom when T<=Tth, in this example.

Figure 14F:
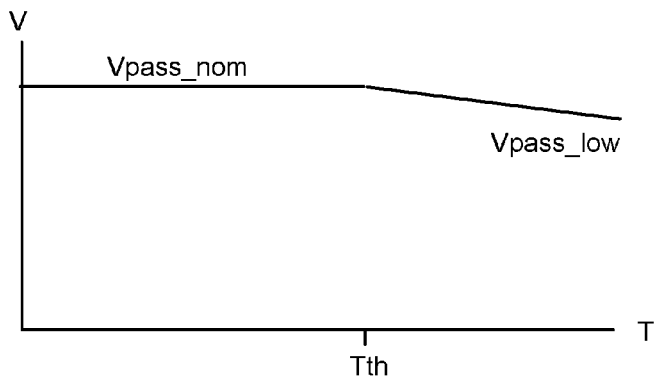
FIG. 14F depicts a plot showing a pass voltage applied to one or more drain-side memory cells during a verify test for an intermediate memory cell, where the pass voltage is set based on a ramp to Vpass_low as a function of T when T>Tth in the last erase operation, consistent with FIGS. 14A and 14B.

FIG. 14F depicts a plot showing a pass voltage applied to one or more drain-side memory cells during a verify test for an intermediate memory cell, where the pass voltage is set based on a ramp to Vpass_low as a function of T when T>Tth in the last erase operation, consistent with FIGS. 14A and 14B. The pass voltage is inversely proportional to T when T>Tth. The pass voltage is Vpass_nom when T<=Tth, in this example.

Figure 15:
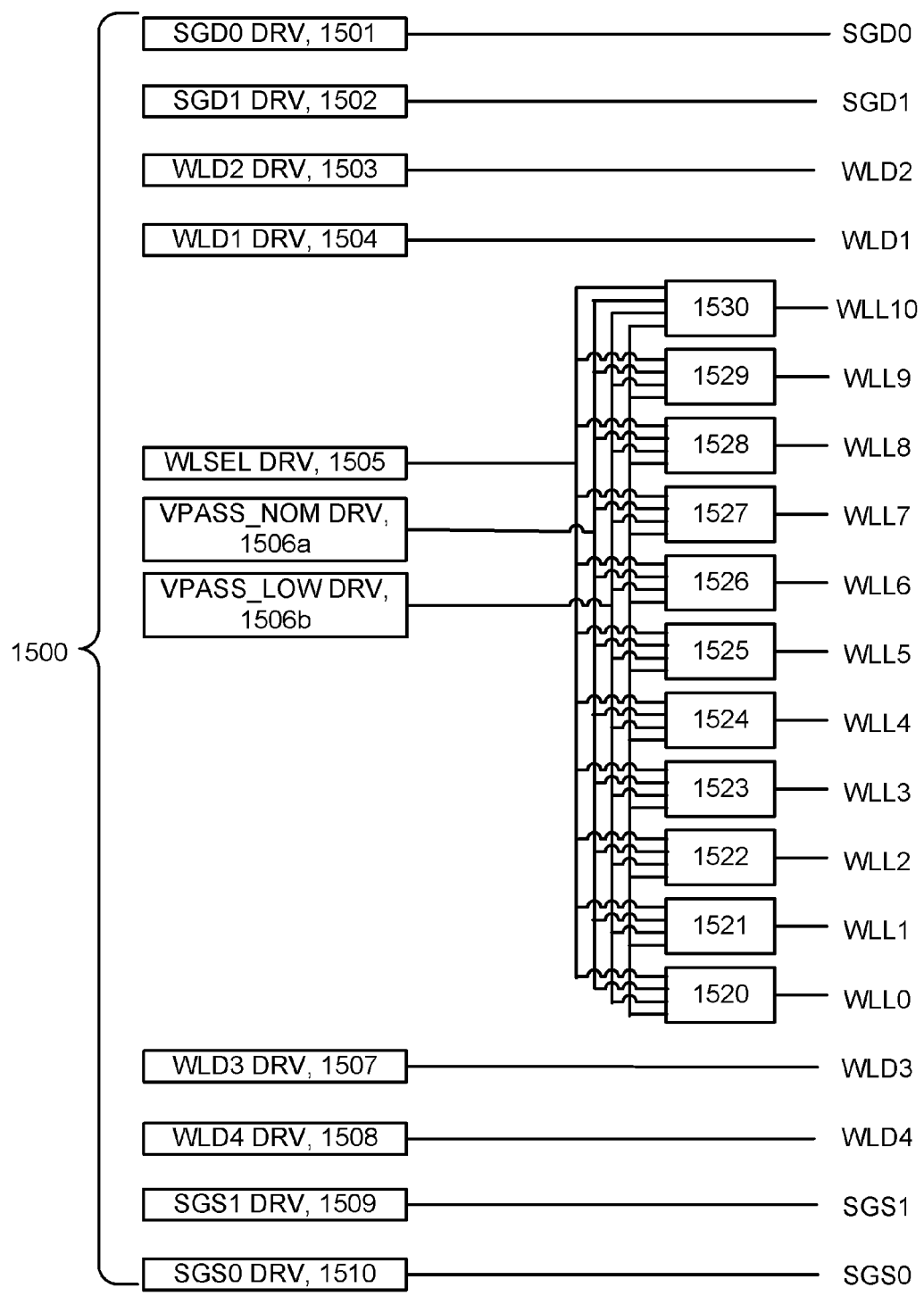
FIG. 15 depicts an example circuit which applies voltages to word lines and select gate lines in a block.

FIG. 15 depicts an example circuit which applies voltages to word lines and select gate lines in a block. The various voltage drivers 1500, such as charge pumps, may be provided as part of the power control module 116 of FIG. 1, for example. An SGD0 driver 1501 (DRV denotes driver) provides a voltage to an SGD0 control line. An SGD1 driver 1502 provides a voltage to an SGD1 control line. A WLD2 driver 1503 provides a voltage to a WLD2 word line. A WLD1 driver 1504 provides a voltage to a WLD1 word line. A WLSEL driver 1505 provides a voltage to any of the data word lines WLL0-WLL10 which is selected, e.g., for programming or reading. For example, this can be a program voltage, a verify voltage or a read voltage. One or more pass voltage drivers can be used to provide one or more pass voltages concurrently to different unselected word lines. These include examples drivers VPASS_NOM DRV 1506a and VPASS_LOW DRV 1506b which provide Vpass_nom and Vpass_low, respectively, consistent with FIG. 14A. The pass voltage drivers provide a voltage the data word lines WLL0-WLL10 which are not selected for programming or reading.

A WLD3 driver 1507 provides a voltage to a WLD3 word line. A WLD4 driver 1508 provides a voltage to a WLD4 word line. An SGS1 driver 1509 provides a voltage to an SGS1 control line. An SGS0 driver 1510 provides a voltage to an SGS0 control line.

A set of switches 1520-1530 are responsive to control signals to pass the voltage from one of the drivers 1505, 1506a and 1506b to the respective data word line. Switches 1520, 1521, 1522, 1523, 1524, 1525, 1526, 1527, 1528, 1529 and 1530 are used for word lines WLL0-WLL10, respectively. The switches can also be controlled to disconnect a driver from the respective data word line to float the voltage of the data word line.

Figure 16A:
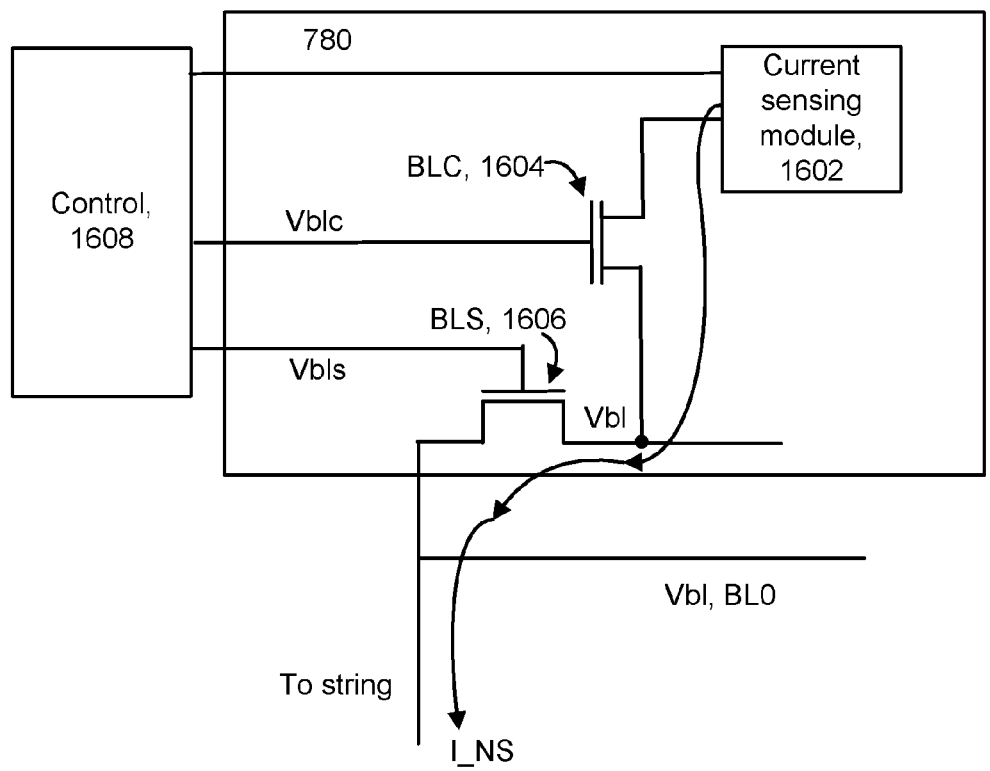
FIG. 16A depicts a configuration of the sensing circuitry 780 of FIG. 7B.

FIG. 16A depicts a configuration of the sensing circuitry 780 of FIG. 7B. The sensing circuitry is connected to the drain end of a string of memory cells such as a NAND string. A bit line BL0 with a volatge Vbl is also connected to the drain end of the string.

A BLS (bit line sense) transistor 1606 which is coupled to the bit line BL0 is a high voltage transistor which is made conductive in response to a control 1608 during sense operations. The control can be provided by any of the control circuits discussed in connection with FIG. 1B, for instance. A BLC (bit line clamp) transistor 1604 is a low voltage transistor which is opened in response to the control to allow the bit line to communicate with a current sensing module 1602. During a sense operation, such as an erase-verify test or a program-verify test, a pre-charge operation occurs in which a capacitor in the current sensing module is charged. The BLC transistor may be made conductive to allow the pre-charging. Also during the sense operation, specified voltages are applied to the word lines.

In an erase operation, an entire block may receive a common erase pulse. The verify operation can determine whether each NAND string is conductive. In one approach, all NAND strings are verified concurrently. In another possible approach, even-numbered NAND strings are verified separately from odd-numbered NAND strings. If all NAND strings are not conductive, an additional erase pulse can be applied. Moreover, for a given NAND string, each memory cell must be conductive in order for the entire NAND string to be conductive, since the memory cells are series-connected in a NAND string.

During sensing, the BLS transistor is made conductive. Additionally, a voltage Vblc is applied to the BLC transistor to make it conductive. The pre-charged capacitor in the current sensing module discharges through the bit line and into the source so that the source acts as a current sink, when the NAND string is conductive. A current I_NS flows in the string. During an erase-verify test, VvEr is applied to the word lines. The verify test is passed if the current exceeds a reference current. During a program-verify test, a verify voltage is applied to the selected word lines and a pass voltage is applied to the unselected word lines. The verify test is passed if the current is below a reference current.

The capacitor at the drain of the NAND string may be pre-charged to a potential which exceeds a potential of the source so that a current flows through the selected nonvolatile memory cell and sinks into the source when each memory cell of the NAND string is in the conductive state.

The current sensing module can sense the cell/memory cell current. In one possible approach, the current sensing module determines a voltage drop which is tied to a fixed current flow by the relationship $\Delta V = iCELL \cdot t/C$, where $\Delta V$ is the voltage drop, iCELL is the fixed current, t is a predetermined discharge time period and C is the capacitance of the pre-charged capacitor in the current sensing module. A greater voltage drops represent higher currents. At the end of a given discharge period, since iCELL and C are fixed, $\Delta V$ for a given current can be determined. If the discharge is sufficiently large in a specified time, the NAND string is deemed to be conductive, so that each memory cell is also conductive. The current sensing module thus can determine whether the associated NAND string is in a conductive or non-conductive state by the level of current.

In one approach, a p-mos transistor is used to determine a level of $\Delta V$ relative to a reference value. In another possible approach, a cell current discriminator serves as a discriminator or comparator of current levels by determining whether the conduction current is higher or lower than a given reference current.

Figure 16B:
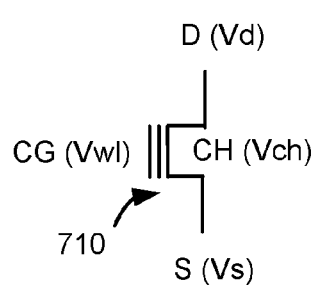
FIG. 16B depicts the example memory cell 710 of FIG. 7A.

FIG. 16B depicts the example memory cell 710 of FIG. 7A. The memory cell comprises a control gate CG which receives a word line voltage Vwll0, a drain at a voltage Vd, a source at a voltage Vs and a channel at a voltage Vch.

Figure 16C:
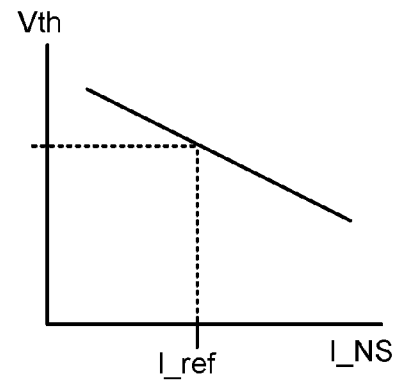
FIG. 16C depicts a plot of Vth versus I_NS, a current in a NAND string during a verify test, consistent with step 1213 of FIG. 12B and step 1222 FIG. 12C.

FIG. 16C depicts a plot of Vth versus I_NS, a current in a NAND string during a verify test, consistent with step 1213 of FIG. 12B and step 1222 FIG. 12C. An erase operation can include a number of erase-verify iterations which are performed until the erase operation is completed. An erase-verify iteration includes an erase portion in which an erase voltage is applied, followed by a verify test. While it possible to verify memory cells in one or more selected word lines, typically an entire block is erased, in which case the verification can be performed concurrently for all memory cells in one or more NAND strings. During a verify operation for the memory cells of a NAND string, an erase-verify voltage is applied to the control gates of the memory cells while a bit line voltage is supplied using sensing circuitry. The select gate transistors and dummy memory cells are provided in a conductive state and act as pass gates. A current in the NAND string is detected and compared to a reference current, I_ref, e.g., using a current comparison circuit. If the current in the NAND string exceeds the reference current, this indicates the cells in the NAND string are in a conductive state, so that their Vth, on average, is below the erase-verify level. That is, the NAND string passes the erase-verify test. On the other hand, if the current in the NAND string does not exceed the reference current, this indicates the cells in the NAND string are in a non-conductive state, so that their Vth, on average, is above the erase-verify voltage. That is, not all of the cells in the NAND string are erased and the NAND string does not pass the erase-verify test.

For a set of NAND strings, the erase operation can be considered to be completed when all, or at least a specified majority, of the NAND strings pass the erase-verify test. If the erase operation is not completed after an erase-verify iteration, another erase-verify iteration can be performed using a stronger erase voltage.

Accordingly, it can be seen that, in one embodiment, an apparatus comprises: means for setting channel-to-control gate voltages of memory cells at a drain-side of a block during an erase operation, wherein the channel-to-control gate voltages of the memory cells at the drain-side of the block are set relatively higher when a temperature is relatively higher; means for setting channel-to-control gate voltages of memory cells at a source-side of the block during the erase operation; and means for setting channel-to-control gate voltages of intermediate memory cells of the block during the erase operation, wherein the intermediate memory cells are between the memory cells at the drain-side of the block and the memory cells at the source-side of the block. The means described above can include the components of the memory device 100 of FIG. 1A, for example. The power control module 116, for instance, controls the power and voltages supplied to the word lines, select gate lines and bit lines during memory operations. Moreover, the means described above can include the components of FIG. 15. For example, the channel voltages can be set by controlling the SGD voltages using the SGD drivers to produce GIDL. The control gate voltage are set by the word line drivers.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
   a string of memory cells extending from one or more drain-side memory cells at a drain-side of the string to one or more source-side memory cells at a source-side of the string, wherein a plurality of intermediate memory cells are between the one or more drain-side memory cells and the one or more source-side memory cells, the string of memory cells comprises a channel and each memory cell of the string of memory cells comprises a control gate;
   a temperature-sensing circuit configured to provide data indicative of a temperature; and
   a control circuit, the control circuit, to erase the string of memory cells, is configured to provide an erase depth for the one or more drain-side memory cells which is deeper than an erase depth of the plurality of intermediate memory cells when the temperature exceeds a threshold.

2. The apparatus of claim 1, wherein:
   the control circuit, to erase the string of memory cells, is configured to provide channel-to-control gate voltages of the one or more drain-side memory cells which decrease with a distance from the drain-side of the string when the temperature exceeds the threshold.

3. The apparatus of claim 1, wherein:
   the control circuit, to erase the string of memory cells, is configured to provide an erase depth for the one or more source-side memory cells which is deeper when the temperature exceeds the threshold than when the temperature does not exceed the threshold.

4. The apparatus of claim 3, wherein:
   the erase depth of the one or more drain-side memory cells is deeper than the erase depth of the one or more source-side memory cells when the temperature exceeds the threshold.

5. The apparatus of claim 1, wherein:
the string of memory cells is in a block of memory cells;
before the erase of the string of memory cells, the control circuit is configured to program memory cells in the block of memory cells to provide programmed memory cells, read the programmed memory cells and determine a number of read errors based on the read of the programmed memory cells; and
the control circuit is configured to provide the erase depth of the one or more drain-side memory cells to be proportional to the number of read errors, when the temperature exceeds the threshold.

6. The apparatus of claim 1, wherein:
the string of memory cells is in a block of memory cells;
before the erase of the string of memory cells, the control circuit is configured to program memory cells in the block of memory cells to provide programmed memory cells, read the programmed memory cells and determine a number of read errors based on the read of the programmed memory cells; and
the control circuit is configured to set the threshold inversely proportional to the number of read errors.

7. The apparatus of claim 1, wherein:
the control circuit is configured to, after the erase of the string of memory cells, program the one or more drain-side memory cells to one or more programmed data states using one or more verify voltages, wherein the one or more verify voltages are inversely proportional to the temperature.

8. The apparatus of claim 1, wherein:
the control circuit, to provide the erase depth of the one or more drain-side memory cells, is configured to charge the channel and provide voltages on the control gates of the one or more drain-side memory cells which are lower when the temperature exceeds the threshold than when the temperature does not exceed the threshold.

9. The apparatus of claim 1, wherein:
the control circuit is configured to, after the erase of the string of memory cells, program a selected memory cell among the plurality of intermediate memory cells to a programmed data state while the one or more drain-side memory cells are in an erased state; and
to determine that the selected memory cell has been programmed to the programmed data state, the control circuit is configured to concurrently:
apply a verify voltage to a control gate of the selected memory cell;
sense a current in the string; and
apply a pass voltage to the one or more drain-side memory cells, wherein the pass voltage is lower when the temperature exceeds the threshold during the erase of the string of memory cells than when the temperature does not exceed the threshold during the erase of the string of memory cells.

10. The apparatus of claim 1, wherein:
the string extends vertically;
the control gates comprise conductive layers in a stack; and
dielectric layers alternate with the conductive layers in the stack.

11. The apparatus of claim 1, wherein:
the control circuit, to erase the string of memory cells, is configured to charge the channel from the drain-side of the string using gate-induced drain leakage.

12. The apparatus of claim 1, wherein:
the one or more drain-side memory cells in the string comprises no more than 25% of the string of memory cells in the string.

13. The apparatus of claim 1, wherein:
the control circuit, to erase the string of memory cells, is configured to provide the erase depth for the one or more drain-side memory cells to be deeper when the temperature exceeds the threshold than when the temperature does not exceed the threshold.

14. The apparatus of claim 1, wherein:
the control circuit, to erase the string of memory cells, is configured to provide the erase depth for the one or more drain-side memory cells to be equal to the erase depth of the plurality of intermediate memory cells when the temperature does not exceed the threshold.

15. The apparatus of claim 1, wherein:
the threshold is a temperature above 25 C.

16. The apparatus of claim 1, wherein:
the control circuit, to provide the erase depth for the one or more drain-side memory cells which is deeper than the erase depth of the plurality of intermediate memory cells, is configured to provide a lower control gate voltage for the one or more drain-side memory cells than for the plurality of intermediate memory cells.

17. The apparatus of claim 1, wherein:
the string of memory cells is in a block of memory cells;
before the erase of the string of memory cells, the control circuit is configured to program memory cells in the block of memory cells to provide programmed memory cells, and measure an amount of program disturb of the programmed memory cells; and
the control circuit is configured to provide the erase depth of the one or more drain-side memory cells to be deeper when the amount of program disturb is greater, when the temperature exceeds the threshold.

18. An apparatus, comprising:
a string of memory cells extending from one or more drain-side memory cells at a drain-side of the string to one or more source-side memory cells at a source-side of the string, wherein a plurality of intermediate memory cells are between the one or more drain-side memory cells and the one or more source-side memory cells, the string of memory cells comprises a channel and each memory cell of the string of memory cells comprises a control gate;
a temperature-sensing circuit configured to provide data indicative of a temperature; and
a control circuit, the control circuit, to erase the string of memory cells, is configured to provide an erase depth for the one or more drain-side memory cells which is deeper when the temperature exceeds a threshold than when the temperature does not exceed the threshold, wherein:
the string of memory cells is in a block of memory cells;
before the erase of the string of memory cells, the control circuit is configured to program memory cells in the block of memory cells to provide programmed memory cells, read the programmed memory cells and determine a number of read errors based on the read of the programmed memory cells; and
the control circuit is configured to provide the erase depth of the one or more drain-side memory cells to be proportional to the number of read errors, when the temperature exceeds the threshold.

19. An apparatus, comprising:

a string of memory cells extending from one or more drain-side memory cells at a drain-side of the string to one or more source-side memory cells at a source-side of the string, wherein a plurality of intermediate memory cells are between the one or more drain-side memory cells and the one or more source-side memory cells, the string of memory cells comprises a channel and each memory cell of the string of memory cells comprises a control gate;

a temperature-sensing circuit configured to provide data indicative of a temperature; and a control circuit, the control circuit, to erase the string of memory cells, is configured to provide an erase depth for the one or more drain-side memory cells which is deeper when the temperature exceeds a threshold than when the temperature does not exceed the threshold;

the control circuit is configured to, after the erase of the string of memory cells, program a selected memory cell among the plurality of intermediate memory cells to a programmed data state while the one or more drain-side memory cells are in an erased state; and to determine that the selected memory cell has been programmed to the programmed data state, the control circuit is configured to concurrently:
 apply a verify voltage to a control gate of the selected memory cell;
 sense a current in the string; and
 apply a pass voltage to the one or more drain-side memory cells, wherein the pass voltage is lower when the temperature exceeds the threshold during the erase of the string of memory cells than when the temperature does not exceed the threshold during the erase of the string of memory cells.

* * * * *